(12) United States Patent
Misaki

(10) Patent No.: US 9,491,857 B2
(45) Date of Patent: Nov. 8, 2016

(54) WIRING CONNECTION STRUCTURE, TERMINAL PORTION, PARALLAX BARRIER SUBSTRATE, AND TOUCH PANEL

(75) Inventor: Katsunori Misaki, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 262 days.

(21) Appl. No.: 14/009,337

(22) PCT Filed: Apr. 2, 2012

(86) PCT No.: PCT/JP2012/058866
§ 371 (c)(1),
(2), (4) Date: Oct. 2, 2013

(87) PCT Pub. No.: WO2012/137710
PCT Pub. Date: Oct. 11, 2012

(65) Prior Publication Data
US 2014/0020944 A1    Jan. 23, 2014

(30) Foreign Application Priority Data

Apr. 6, 2011 (JP) ................................. 2011-084355

(51) Int. Cl.
*H05K 1/11* (2006.01)
*G02B 27/22* (2006.01)
*G06F 3/044* (2006.01)
*G02F 1/1333* (2006.01)
*C03C 27/06* (2006.01)

(52) U.S. Cl.
CPC ................. *H05K 1/11* (2013.01); *C03C 27/06* (2013.01); *G02B 27/2214* (2013.01); *G02F 1/13338* (2013.01); *G06F 3/044* (2013.01)

(58) Field of Classification Search
CPC ........... G02B 27/2214; G02F 1/13338; G06F 3/044; H05K 1/11
USPC ........................................................... 174/261
See application file for complete search history.

(56) References Cited

U.S. PATENT DOCUMENTS

2009/0133743 A1*  5/2009  Matsui ................. H01G 9/2068
                                                          136/252
2010/0309162 A1* 12/2010  Nakanishi ............... G06F 3/044
                                                          345/174
2011/0043715 A1   2/2011  Ohyama et al.

FOREIGN PATENT DOCUMENTS

| JP | 63-168994 A | 11/1988 |
| JP | 1-115141 A | 5/1989 |
| JP | 2588545 B2 * | 3/1997 |
| JP | 2005-235481 A | 9/2005 |
| JP | 2010-282501 A | 12/2010 |
| JP | 2011-043623 A | 3/2011 |

OTHER PUBLICATIONS

Official Communication issued in International Patent Application No. PCT/JP2012/058866, mailed on Jun. 12, 2012.

* cited by examiner

*Primary Examiner* — Timothy Thompson
*Assistant Examiner* — Paul McGee, III
(74) *Attorney, Agent, or Firm* — Keating & Bennett, LLP

(57) ABSTRACT

There is provided a wiring connection structure connecting a transparent conductive film formed on a main surface of a transparent substrate having the main surface and a metal wiring formed on the main surface and made of a metal material, wherein the metal wiring is formed to extend from the main surface onto the transparent conductive film and to cover the transparent conductive film.

11 Claims, 27 Drawing Sheets

WIRING CONNECTION STRUCTURE, TERMINAL PORTION, PARALLAX BARRIER SUBSTRATE, AND TOUCH PANEL

TECHNICAL FIELD

The present invention relates to a wiring connection structure, a terminal portion, a parallax barrier substrate, and a touch panel.

BACKGROUND ART

Conventionally, an image display panel, a touch panel, a parallax barrier substrate for three-dimensional display and the like include a glass substrate, a transparent conductive wiring formed on the glass substrate, and a metal wiring formed on the glass substrate. The transparent conductive wiring and the metal wiring are connected by forming the transparent conductive wiring on the metal wiring.

An organic EL (electroluminescence) panel described in Japanese Patent Laying-Open No. 2005-235481 includes a support substrate, a lower electrode formed on the support substrate, an organic light-emitting function layer formed on the lower electrode, an upper electrode formed on the organic light-emitting function layer, and a lead wiring led out from the lower electrode.

An organic EL element is formed in an organic EL element forming region located near a central portion of the support substrate. The lead wiring is formed to extend from the organic EL element forming region, through a bonding region located outside the organic EL element forming region, to a connection peripheral region located closer to the outer perimeter side than this bonding region.

The lead wiring includes a base layer connected to the lower electrode formed in the organic EL element forming region, a first stacked film formed on the base layer, and a second stacked film formed on the first stacked film.

The base layer is formed of, for example, an ITO film and formed to extend from the organic EL element forming region to the connection peripheral region. The first stacked film is made of at least one or more metals selected from Cr, To, Mo, Ni, W, Au, Co, Ta, and Mg, or an alloy thereof. This first stacked film is formed on a portion of an upper surface of the aforementioned base layer located in the bonding region and the connection peripheral region.

The second stacked film is made of Ag or an alloy of Ag. This second stacked film is formed on a portion of the first stacked film located in the connection peripheral region.

CITATION LIST

Patent Document

PTD 1: Japanese Patent Laying-Open No. 2005-235481

SUMMARY OF INVENTION

Technical Problem

In the organic EL panel described in Japanese Patent Laying-Open No. 2005-235481, the base layer is an ITO film and the first stacked film is a metal film of Cr, To and the like, and thus, the base layer is corroded. When the base layer is corroded, the adhesion between the base layer and the first stacked film decreases, which may lead to peel-off of the first stacked film from the base layer.

The present invention has been made in light of the aforementioned problem, and an object thereof is to provide a wiring connection structure, a terminal portion, a parallax barrier substrate, and a touch panel, which can prevent peel-off of a metal wiring in a connection portion connecting a transparent conductive wiring and the metal wiring.

Solution to Problem

A wiring connection structure according to the present invention is a wiring connection structure connecting a transparent conductive film formed on a main surface of a transparent substrate having the main surface and a metal wiring formed on the main surface and made of a metal material. The metal wiring is formed to extend from the main surface onto the transparent conductive film and to cover the transparent conductive film.

Preferably, a hole is formed in the transparent conductive film to extend from an upper surface to the main surface. The metal wiring formed to cover the transparent conductive wiring is formed to be in contact with the main surface located at the hole.

Preferably, assuming that a contact area S1 represents a contact area between the transparent conductive film and the metal wiring, and contact area S2 represents a contact area between the metal wiring and the main surface located at the hole, contact area S1 and contact area S2 satisfy a relational expression of (contact area S1)×⅕<(contact area S2). Preferably, a plurality of the holes are formed.

Preferably, the transparent substrate is a glass substrate. The transparent conductive film is an ITO (Indium Tin Oxide) film. The metal material includes at least one of titanium (Ti), molybdenum (Mo), tantalum (Ta), tungsten (W), and chromium (Cr) as a main ingredient.

Preferably, the transparent conductive film includes a first wiring main body portion and a first wide portion connected to the first wiring main body portion and formed to be wider than the first wiring main body portion. The metal wiring includes a second wiring main body portion and a second wide portion formed to be wider than the second wiring main body portion and formed to cover the first wide portion. When the first wide portion and second wide portion are viewed from a direction perpendicular to the main surface, the first wide portion is located inside the second wide portion.

Preferably, a hole is formed in the first wide portion to extend from an upper surface of the first wide portion to the main surface. The second wide portion is formed to cover the first wide portion and to be in contact with the main surface exposed from the hole.

Preferably, assuming that a contact area S1 represents a contact area between the first wide portion and the second wide portion, and a contact area S2 represents a contact area between the metal wiring and the main surface exposed from the hole, the contact area S1 and contact area S2 satisfy a relational expression of (contact area S1)×⅕<(contact area S2). Preferably, more than a half of an upper surface of the first wide portion is covered by the second wide portion.

A terminal portion according to the present invention is a terminal portion including the aforementioned wiring connection structure, wherein more than at least a half of an upper surface of the transparent conductive film is covered by the metal wiring. A parallax barrier substrate according to the present invention includes the aforementioned wiring connection structure. A touch panel according to the present invention includes the aforementioned wiring connection structure.

Advantageous Effects of Invention

In the wiring connection structure, the terminal portion, the parallax barrier substrate, and the touch panel according to the present invention, occurrence of peel-off in the connection portion connecting the metal wiring and the transparent conductive wiring can be suppressed.

DESCRIPTION OF EMBODIMENTS

First Embodiment

A wiring connection structure, a parallax barrier substrate and a touch panel according to a first embodiment will be described with reference to FIGS. 1 to 24.

Figure 1:
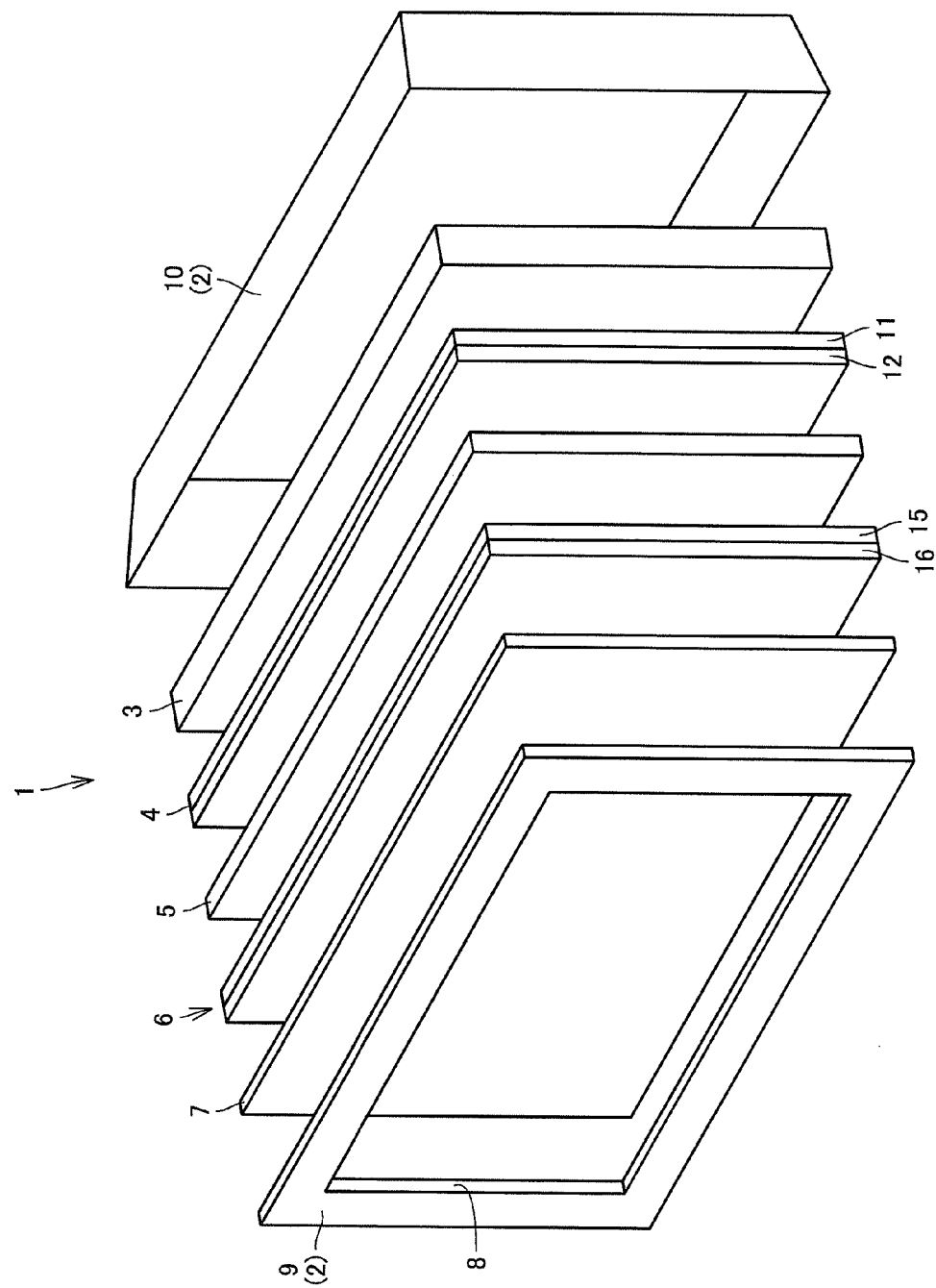
FIG. 1 is a schematic view schematically showing a liquid crystal display device including a parallax barrier substrate and a touch panel according to the present embodiment.

FIG. 1 is a schematic view schematically showing a liquid crystal display device including the parallax barrier substrate and the touch panel according to the present embodiment. The liquid crystal display device according to the present embodiment is a display device that can display three-dimensional images and two-dimensional images.

As shown in FIG. 1, the liquid crystal display device includes a housing 2, a backlight unit 3 contained in housing 2, a liquid crystal display panel 4 arranged on the front surface side of backlight unit 3, a spacer 5 arranged on the front surface side of liquid crystal display panel 4, a parallax barrier substrate 6 arranged on the front surface side of spacer 5, and a touch panel 7 arranged on the front surface side of parallax barrier substrate 6.

Housing 2 includes a frame-shaped front surface cover 9 having a window portion 8, and a rear surface cover 10 formed in the shape of a box.

Backlight unit 3 includes, for example, a plurality of light sources such as LEDs and emits light toward liquid crystal display panel 4.

Liquid crystal display panel 4 includes a TFT substrate 11 arranged on the backlight unit 3 side, an opposed substrate 12 arranged on the opposite side of backlight unit 3 with respect to TFT substrate 11, and a liquid crystal layer encapsulated between TFT substrate 11 and opposed substrate 12.

TFT substrate 11 and opposed substrate 12 are spaced apart from each other. Opposed substrate 12 includes a glass substrate having a main surface facing TFT substrate 11, a common electrode formed on this main surface, and a color filter.

The color filter includes a black matrix formed in the shape of a grid, for example, and having a plurality of window portions, as well as a red filter portion, a blue filter portion and a green filter portion that are formed in the window portions. One red filter portion, one blue filter portion and one green filter portion form one pixel.

TFT substrate 11 includes a glass substrate having a main surface facing opposed substrate 12, a plurality of TFT elements formed on this main surface, and a plurality of pixel electrodes connected to drain electrodes of the TFT elements.

One TFT element and one pixel electrode are formed at a position facing one filter portion. Therefore, in the case of a color filter of three colors, three pixel electrodes form one pixel.

Liquid crystal display panel 4 includes a plurality of pixels for the right eye that display an image for the observer's right eye in a three-dimensional display mode, and a plurality of pixels for the left eye that display an image for the observer's left eye in the three-dimensional display mode.

For example, the TFT pixels for the right eye are spaced apart from one another in the height direction and in the horizontal direction, and are arranged in the shape of a grid. The TFT pixel for the left eye is arranged between the TFT pixels for the right eye. Therefore, the TFT pixels for the left eye are also spaced apart from one another in the height direction and in the horizontal direction, and are also arranged in the shape of a grid (in the staggered manner).

Spacer 5 is, for example, a transparent substrate such as a glass substrate. This spacer 5 is a member for defining a spacing between liquid crystal display panel 4 and parallax barrier substrate 6 to be a prescribed spacing.

Parallax barrier substrate 6 includes a first substrate 15 arranged on a main surface of spacer 5, a second substrate 16 arranged on the opposite side of spacer 5 with respect to first substrate 15, and a liquid crystal layer arranged between first substrate 15 and second substrate 16.

First substrate 15 includes a glass substrate and a strip-shaped first electrode formed on a main surface of this glass substrate. Second substrate 16 includes a glass substrate and a strip-shaped second electrode formed on a main surface of this glass substrate.

By application of a prescribed voltage to the aforementioned first and second electrodes, liquid crystal molecules in a portion of the liquid crystal layer sandwiched between the first electrode and the second electrode are moved. As a result, the grid-shaped parallax barrier is formed.

Touch panel 7 is a panel for detecting which position on an operation surface of touch panel 7 is touched by the user.

Each of parallax barrier substrate 6 and touch panel 7 includes a transparent conductive film formed on a glass substrate, a transparent conductive wiring connected to this transparent conductive film, a metal wiring, a terminal portion connected to the metal wiring and having an external terminal connected thereto, and a connection portion connecting the metal wiring and the transparent conductive wiring.

In the present embodiment, peel-off of the metal wiring and the transparent conductive wiring is suppressed in the connection portion connecting the metal wiring and the transparent conductive wiring.

Thus, a configuration of parallax barrier substrate 6 and a configuration of the connection portion in parallax barrier substrate 6 will be described first with reference to FIGS. 2 to 11.

Figure 2:
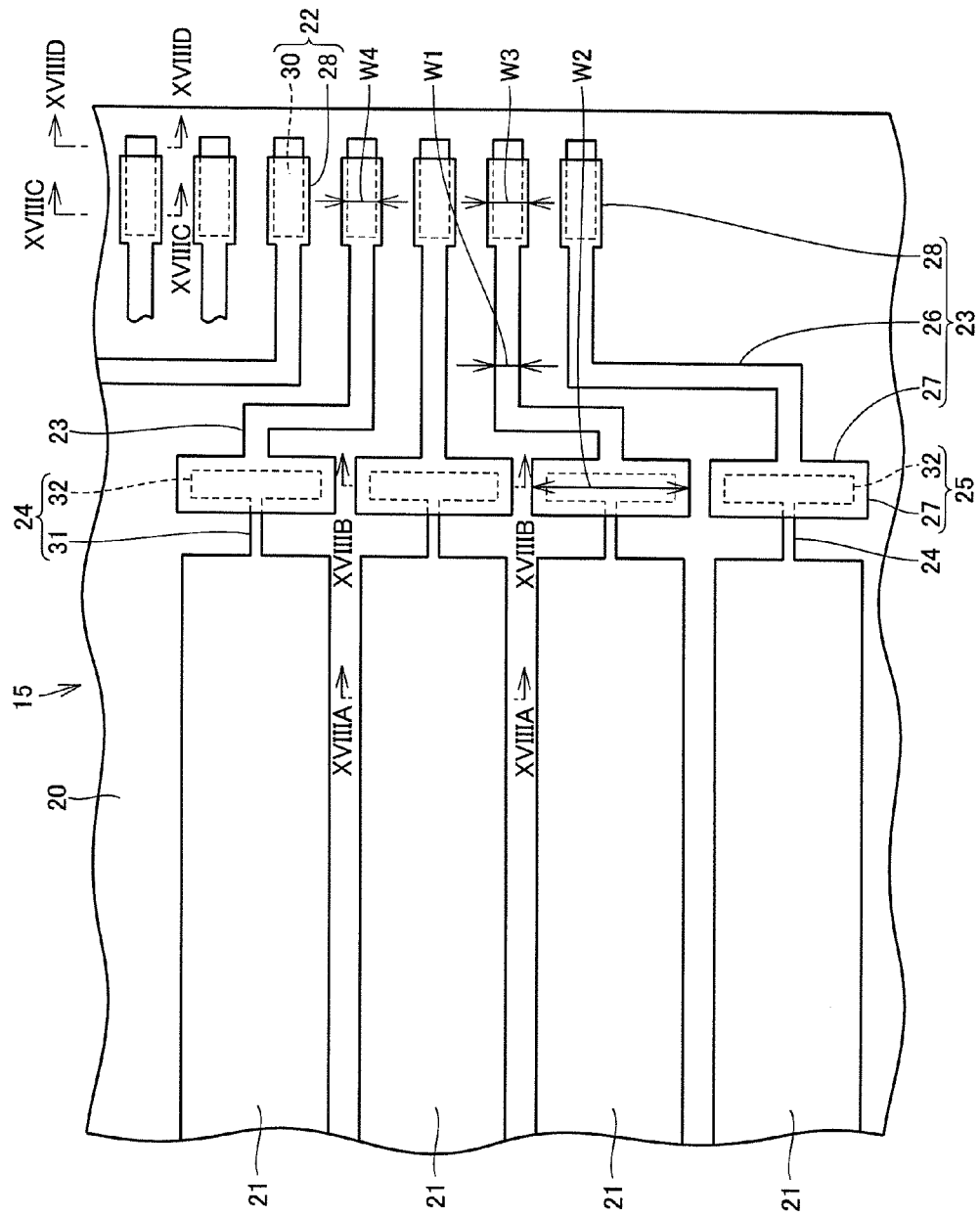
FIG. 2 is a plan view showing a part of a first substrate 15 of a parallax barrier substrate 6.

FIG. 2 is a plan view showing a part of first substrate 15 of parallax barrier substrate 6. As shown in this FIG. 2, first substrate 15 includes a transparent substrate 20 having a main surface, a plurality of first transparent electrodes 21 formed on the main surface of this transparent substrate 20, a plurality of terminal portions 22 provided at an outer perimeter of transparent substrate 20, a metal wiring 23 connected to terminal portion 22, a transparent conductive wiring 24 connected integrally to first transparent electrode 21, and a connection portion 25 connecting transparent conductive wiring 24 and metal wiring 23. Transparent substrate 20 is formed of, for example, a glass substrate and the like.

First transparent electrode 21 is formed of, for example, a transparent conductive film such as an ITO film or an IZO (Indium-Zinc-oxide) film. First transparent electrode 21 is formed to be elongated in a first direction, and first transparent electrodes 21 are spaced apart from one another in a second direction. The plurality of terminal portions 22 are spaced apart from one another along an outer perimeter edge portion of transparent substrate 20.

Metal wiring 23 is formed to extend between terminal portion 22 and connection portion 25. Metal wiring 23 is made of, for example, a metal material including at least one of titanium (Ti), molybdenum (Mo), tantalum (Ta), tungsten (W), and chromium (Cr) as a main ingredient.

Metal wiring 23 includes a wiring main body portion 26, a wide portion 27 connected to one end of wiring main body portion 26, and a wide portion 28 connected to the other end of wiring main body portion 26.

A width W1 of wiring main body portion 26 perpendicular to the length direction of metal wiring 23 is smaller than a width W2 of wide portion 27 and a width W3 of wide portion 28 perpendicular to the length direction of metal wiring 23. Wide portion 27 and wide portion 28 are formed to be wider than wiring main body portion 26.

Terminal portion 22 is formed by a transparent conductive film 30 formed on the main surface of transparent substrate 20, and wide portion 28 of metal wiring 23.

Transparent conductive film 30 is formed of a transparent conductive film such as an ITO film or an IZO film, and a width W4 of transparent conductive film 30 is smaller than width W3 of wide portion 28. Wide portion 28 is formed to cover more than at least a half of an upper surface of transparent conductive film 30.

Transparent conductive wiring 24 is connected integrally to first transparent electrode 21, and this transparent conductive wiring 24 is formed of, for example, a transparent conductive film such as an ITO film or an IZO film. Connection portion 25 connects transparent conductive wiring 24 and metal wiring 23.

Transparent conductive wiring 24 includes a wiring main body portion 31 connected integrally to first transparent electrode 21, and a wide portion 32 connected to an end of wiring main body portion 31.

Connection portion 25 is formed by wide portion 32 formed on the main surface of transparent substrate 20, and wide portion 27 formed to cover this wide portion 32.

Figure 3:
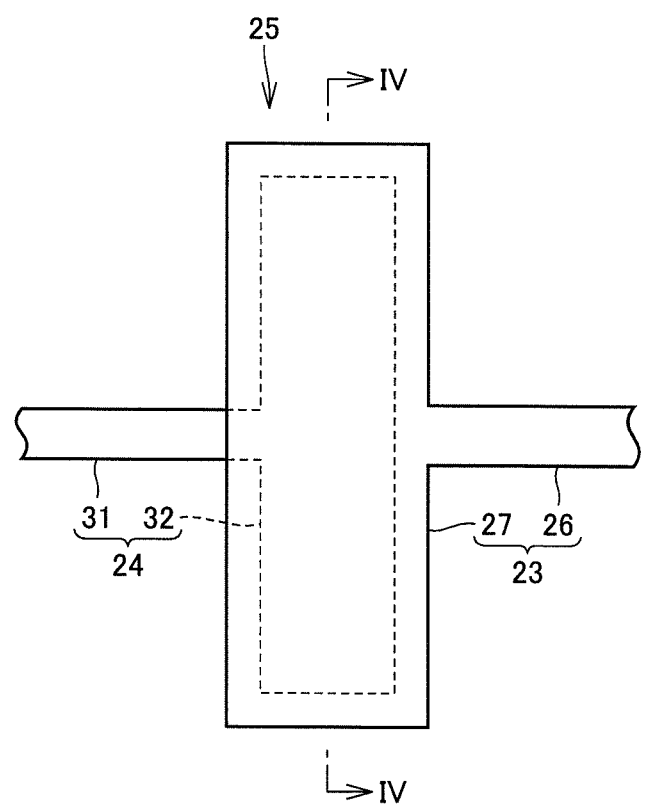
FIG. 3 is a plan view showing a connection portion 25.
Figure 4:
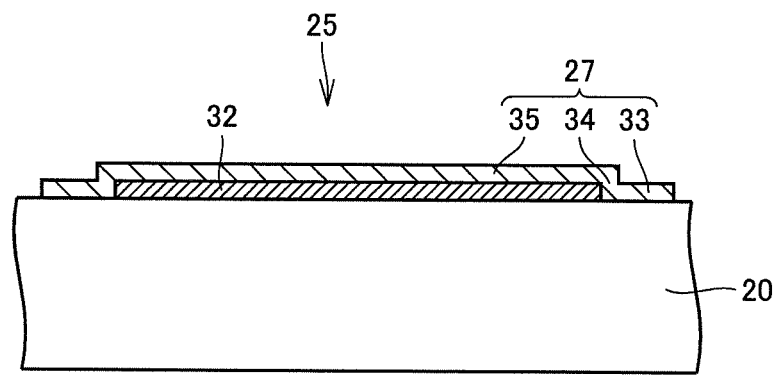
FIG. 4 is a cross-sectional view taken along line IV-IV in FIG. 3.

FIG. 3 is a plan view showing connection portion 25, and FIG. 4 is a cross-sectional view taken along line IV-IV in FIG. 3. As shown in these FIGS. 3 and 4, wide portion 27 of metal wiring 23 is formed to extend from the main surface of transparent substrate 20 onto an upper surface of wide portion 32 and to cover the entire surface of wide portion 32.

Wide portion 27 includes an edge portion 33 that is in contact with a portion of the main surface of transparent substrate 20 located around wide portion 32, a perimeter wall portion 34 connected to edge portion 33 and formed on a perimeter surface of wide portion 32, and an upper surface portion 35 connected to perimeter wall portion 34 and covering the upper surface of wide portion 32.

Edge portion 33 is annularly formed along an outer perimeter of wide portion 32. Therefore, when wide portion 32 and wide portion 27 are viewed from above the main surface of transparent substrate 20 in a direction perpendicular to the main surface, wide portion 32 is located inside wide portion 27. Since wide portion 27 is made of the metal material as described above, the adhesion between edge portion 33 and transparent substrate 20 is high and peel-off of edge portion 33 from transparent substrate 20 is suppressed.

Since wide portion 32 is formed of the ITO film and the like and wide portion 27 is made of the metal material described above, the oxidation reduction reaction may occur between wide portion 32 and wide portion 27.

When the oxidation reduction reaction occurs between wide portion 32 and upper surface portion 35, wide portion 32 is corroded and a metal In is precipitated. As a result, the adhesion between perimeter wall portion 34 and upper surface portion 35 of wide portion 27 and wide portion 32 may decrease.

At this time, the adhesion between edge portion 33 of wide portion 27 and transparent substrate 20 is high, and thus, peel-off of wide portion 27 from transparent substrate 20 is suppressed. Since edge portion 33 is formed substantially annularly to surround wide portion 32, an adhesion area between transparent substrate 20 and edge portion 33 is large and peel-off of wide portion 27 is suppressed.

Even when wide portion 32 is further corroded and the adhesion between wide portion 32 and transparent substrate 20 decreases, peel-off of wide portion 32 from transparent substrate 20 is suppressed because wide portion 27 is formed to cover wide portion 32.

Figure 5:
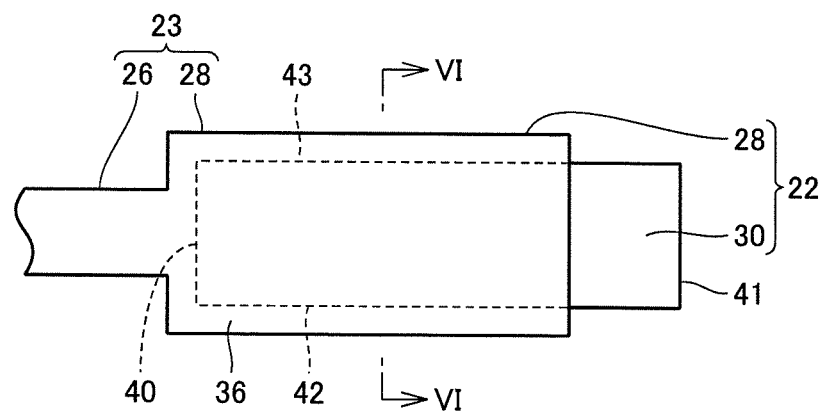
FIG. 5 is a plan view showing a terminal portion 22.
Figure 6:
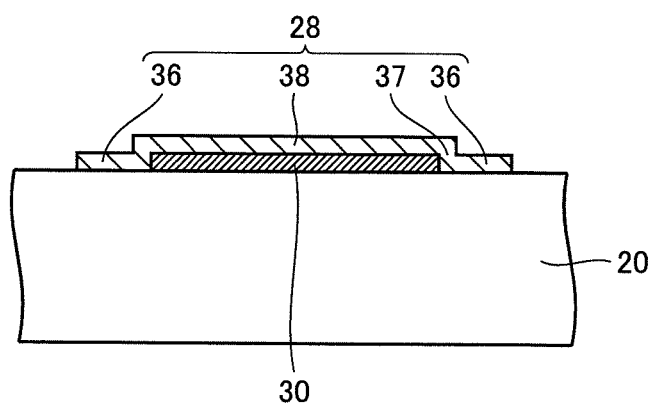
FIG. 6 is a cross-sectional view taken along line VI-VI in FIG. 5.

FIG. 5 is a plan view showing terminal portion 22, and FIG. 6 is a cross-sectional view taken along line VI-VI in FIG. 5. Referring to FIG. 5, transparent conductive film 30 is formed in the substantially rectangular shape when viewed two-dimensionally. Transparent conductive film 30 includes short side portions 40 and 41, and long side portions 42 and 43 connecting short side portion 40 and short side portion 41.

As shown in FIGS. 5 and 6, wide portion 28 is formed to cover more than a half of the upper surface of transparent conductive film 30. As shown in FIG. 6, wide portion 28 includes an edge portion 36 that is in contact with a portion of the upper surface of transparent substrate 20 adjacent to transparent conductive film 30, a perimeter wall portion 37 connected to edge portion 36 and formed on a perimeter surface of transparent conductive film 30, and an upper surface portion 38 formed on the upper surface of transparent conductive film 30.

Referring to FIG. 5, edge portion 36 is in contact with a portion of the main surface of transparent substrate 20 adjacent to short side portion 40 and most of a portion of the main surface of transparent substrate 20 adjacent to long side portions 42 and 43. Therefore, a contact area between edge portion 36 and transparent substrate 20 is large, and even when transparent conductive film 30 is corroded, peel-off of wide portion 28 from transparent substrate 20 is suppressed.

A contact area between transparent conductive film 30 and wide portion 28 is larger than an area of a portion of transparent conductive film 30 exposed from wide portion 28. Therefore, even when transparent conductive film 30 is corroded and the adhesion between transparent conductive film 30 and transparent substrate 20 decreases, wide portion 28 can press transparent conductive film 30 against transparent substrate 20 and peel-off of transparent conductive film 30 from transparent substrate 20 is suppressed.

Figure 7:
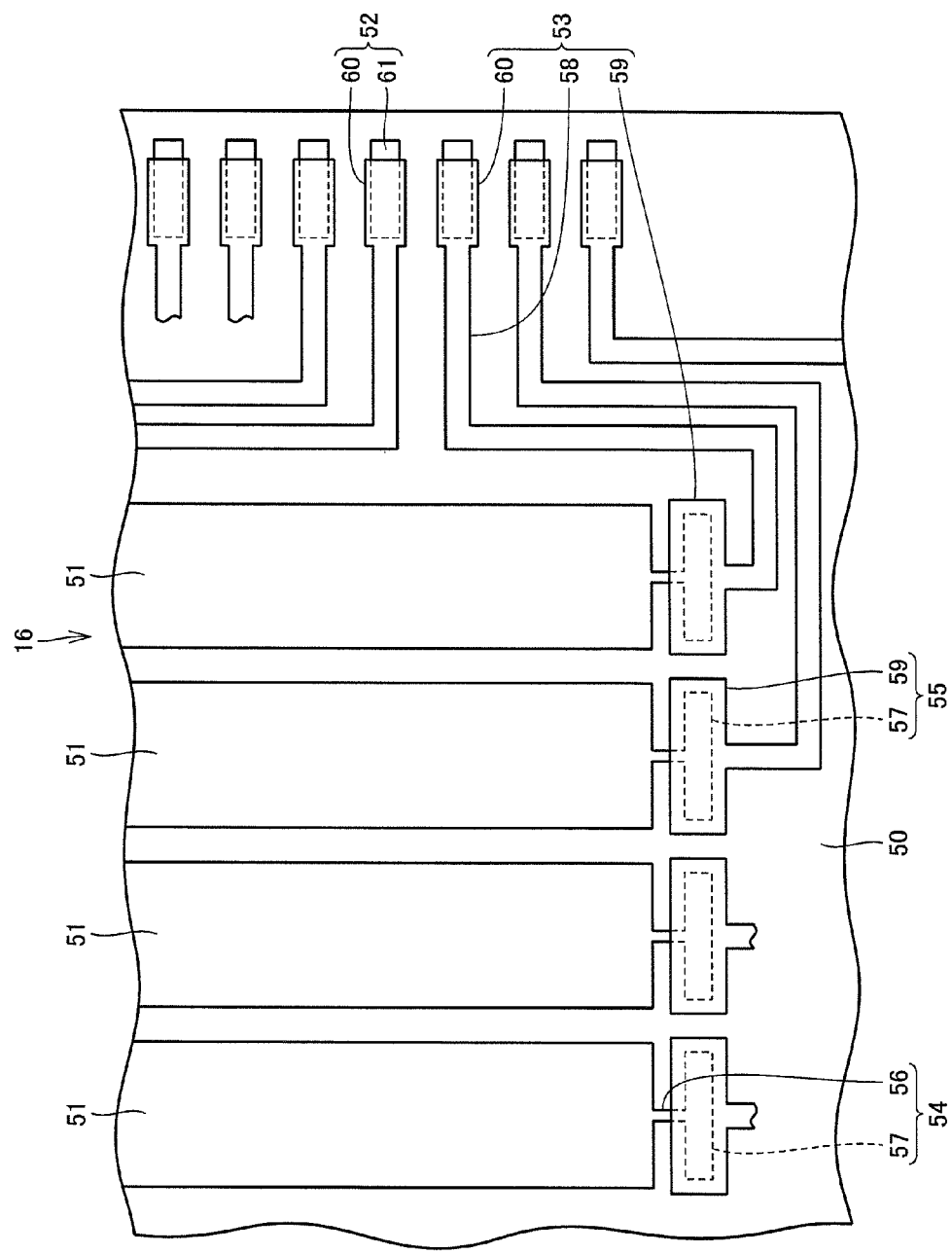
FIG. 7 is a plan view showing a second substrate 16 of parallax barrier substrate 6.

FIG. 7 is a plan view showing second substrate 16 of parallax barrier substrate 6. As shown in this FIG. 7, second substrate 16 includes a transparent substrate 50 having a main surface, a plurality of second transparent electrodes 51 formed on the main surface of this transparent substrate 50, a plurality of terminal portions 52 provided at an outer perimeter of transparent substrate 50, a metal wiring 53 connected to terminal portion 52, a transparent conductive wiring 54 connected integrally to second transparent electrode 51, and a connection portion 55 connecting transparent conductive wiring 54 and metal wiring 53. Transparent substrate 50 is formed of, for example, a glass substrate.

Second transparent electrode 51 extends in a direction orthogonal to first transparent electrode 21 shown in FIG. 2. Specifically, second transparent electrode 51 is formed to be elongated in the second direction, and second transparent electrodes 51 are spaced apart from one another in the first direction.

Second transparent electrode 51 is formed of, for example, a transparent conductive film such as an ITO film or an IZO film.

Transparent conductive wiring 54 is formed integrally with second transparent electrode 51. Transparent conductive wiring 54 includes a wiring main body portion 56 connected to second transparent electrode 51, and a wide portion 57 formed at an end of wiring main body portion 56, and wide portion 57 is formed to be wider than wiring main body portion 56. Transparent conductive wiring 54 is also formed of an ITO film or an IZO film.

Metal wiring 53 includes a wiring main body portion 58, a wide portion 59 connected to one end of wiring main body portion 58, and a wide portion 60 connected to the other end of wiring main body portion 58.

The width of wide portion 59 and the width of wide portion 60 are larger than the width of wiring main body portion 58. Metal wiring 53 is made of, for example, a metal material including at least one of titanium (Ti), molybdenum (Mo), tantalum (Ta), tungsten (W), and chromium (Cr) as a main ingredient.

Connection portion 55 is formed by wide portion 57 of transparent conductive wiring 54 and wide portion 59 of metal wiring 53.

Terminal portion 52 includes a transparent conductive film 61 formed on the main surface of transparent substrate 50, and wide portion 60 formed to cover transparent conductive film 61. An external terminal connected to a drive circuit is connected to terminal portion 52.

Figure 8:
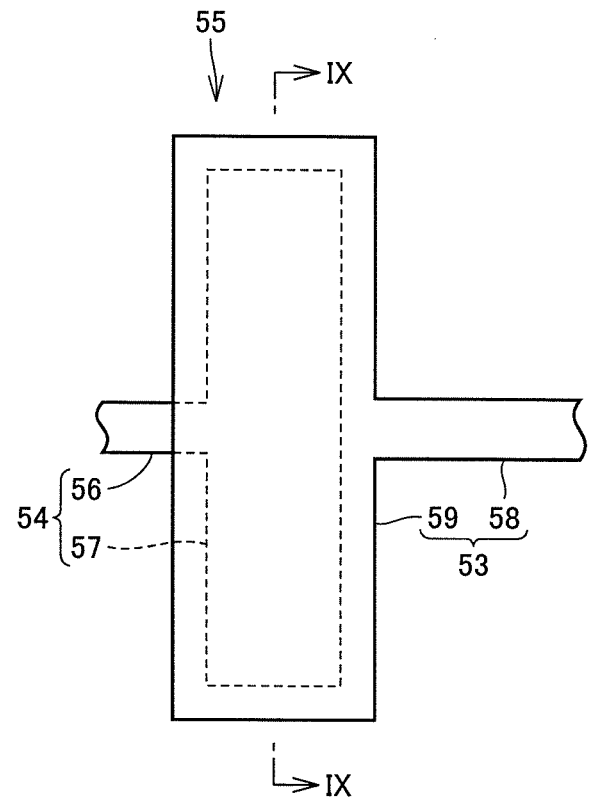
FIG. 8 is a plan view showing a connection portion 55.
Figure 9:
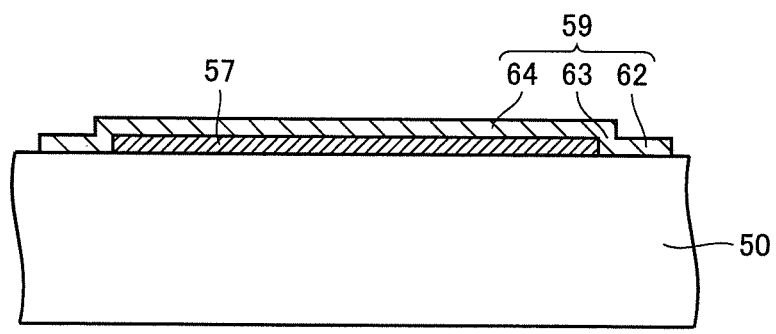
FIG. 9 is a cross-sectional view taken along line IX-IX shown in FIG. 8.

FIG. 8 is a plan view showing connection portion 55, and FIG. 9 is a cross-sectional view taken along line IX-IX shown in FIG. 8.

As shown in FIG. 8, wide portion 59 is formed to extend from a portion of the main surface of transparent substrate 20 located around wide portion 57 to an upper surface of wide portion 57 and is formed to cover wide portion 57. When wide portion 57 and wide portion 59 are viewed from above the main surface of transparent substrate 50, wide portion 57 is located inside wide portion 59. An edge portion 62 is annularly formed to surround wide portion 57. Therefore, an adhesion area between wide portion 59 and transparent substrate 50 is large and peel-off of wide portion 59 from transparent substrate 50 is suppressed.

Therefore, even when wide portion 57 is corroded and the adhesion between wide portion 57 and wide portion 59 decreases, peel-off of wide portion 59 from transparent substrate 50 is suppressed. Furthermore, wide portion 59 is formed to cover wide portion 57, and thus, even when the adhesion between wide portion 57 and transparent substrate 50 decreases, wide portion 59 can press wide portion 57 against transparent substrate 50 and peel-off of wide portion 57 from transparent substrate 50 is suppressed.

Figure 10:
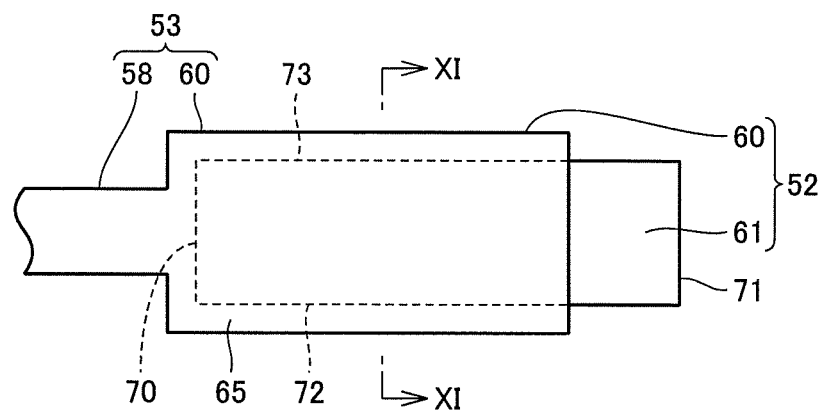
FIG. 10 is a plan view showing a terminal portion 52.
Figure 11:
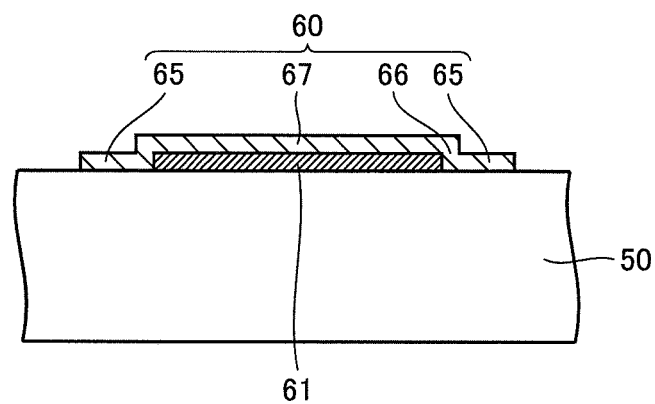
FIG. 11 is a cross-sectional view taken along line XI-XI in FIG. 10.

FIG. 10 is a plan view showing terminal portion 52, and FIG. 11 is a cross-sectional view taken along line XI-XI in FIG. 10.

As shown in FIG. 10, terminal portion 52 includes transparent conductive film 61 formed on the main surface of transparent substrate 50, and wide portion 60 formed to cover more than a half of this transparent conductive film 61.

Referring to FIG. 11, wide portion 60 includes an edge portion 65 that is in contact with a portion of the main surface of transparent substrate 50 adjacent to transparent conductive film 61, a perimeter wall portion 66 connected to edge portion 65 and formed on a perimeter surface of transparent conductive film 61, and an upper surface portion 67 connected to perimeter wall portion 66 and formed on an upper surface of transparent conductive film 61.

As shown in FIG. 10, transparent conductive film 61 is formed in the rectangular shape and includes short side portions 70 and 71, and long side portions 72 and 73. Edge portion 65 is in contact with a portion of the main surface of transparent substrate 50 adjacent to short side portion 70 and more than a half of a portion of the main surface of transparent substrate 50 adjacent to long side portions 72 and 73.

As described above, edge portion 65 of wide portion 60 is in contact with transparent substrate 50 over a large area, and thus, peel-off of wide portion 60 from transparent substrate 50 is suppressed.

Wide portion 60 is formed to cover more than a half of transparent conductive film 61, and thus, even when the adhesion between transparent conductive film 61 and transparent substrate 50 decreases, wide portion 60 can press transparent conductive film 61 against transparent substrate 50. As a result, peel-off of transparent conductive film 61 from transparent substrate 50 is suppressed.

As described above, in parallax barrier substrate 6 shown in FIG. 1, peel-off of the transparent conductive film is suppressed in the connection portion connecting the transparent conductive wiring and the metal wiring. Peel-off of the transparent conductive film is also suppressed in the terminal portion to which the external terminal is connected.

Now, the operation of parallax barrier substrate 6 will be described with reference to FIGS. 1, 2 and 7. Referring to FIG. 1, when image display device 1 displays a two-dimensional image, a voltage is not applied to first transparent electrodes 21 shown in FIG. 2 and second transparent electrodes 51 shown in FIG. 7.

Therefore, the observer can check the image displayed on liquid crystal display panel 4, through spacer 5, parallax barrier substrate 6 and touch panel 7.

When image display device 1 displays a three-dimensional image, an image for the observer's right eye is displayed on the pixels for the right eye of liquid crystal display panel 4, and an image for the observer's left eye is displayed on the pixels for the left eye.

Furthermore, a prescribed voltage is applied to each of first substrate 15 shown in FIG. 2 and second substrate 16 shown in FIG. 7.

When the voltage is applied to between first substrate 15 and second substrate 16, the liquid crystal molecules in the liquid crystal layer sandwiched between first substrate 15 and second substrate 16 change their positions. As a result, a dark portion is formed in a portion where first substrate 15 and second substrate 16 overlap each other.

Therefore, the parallax barrier is formed when parallax barrier substrate 6 is turned on. As a result, the image for the right eye displayed on liquid crystal display panel 4 are observed by the observer's right eye and the image for the left eye are observed by the observer's left eye. The observer can thus recognize the stereoscopic image.

Figure 12:
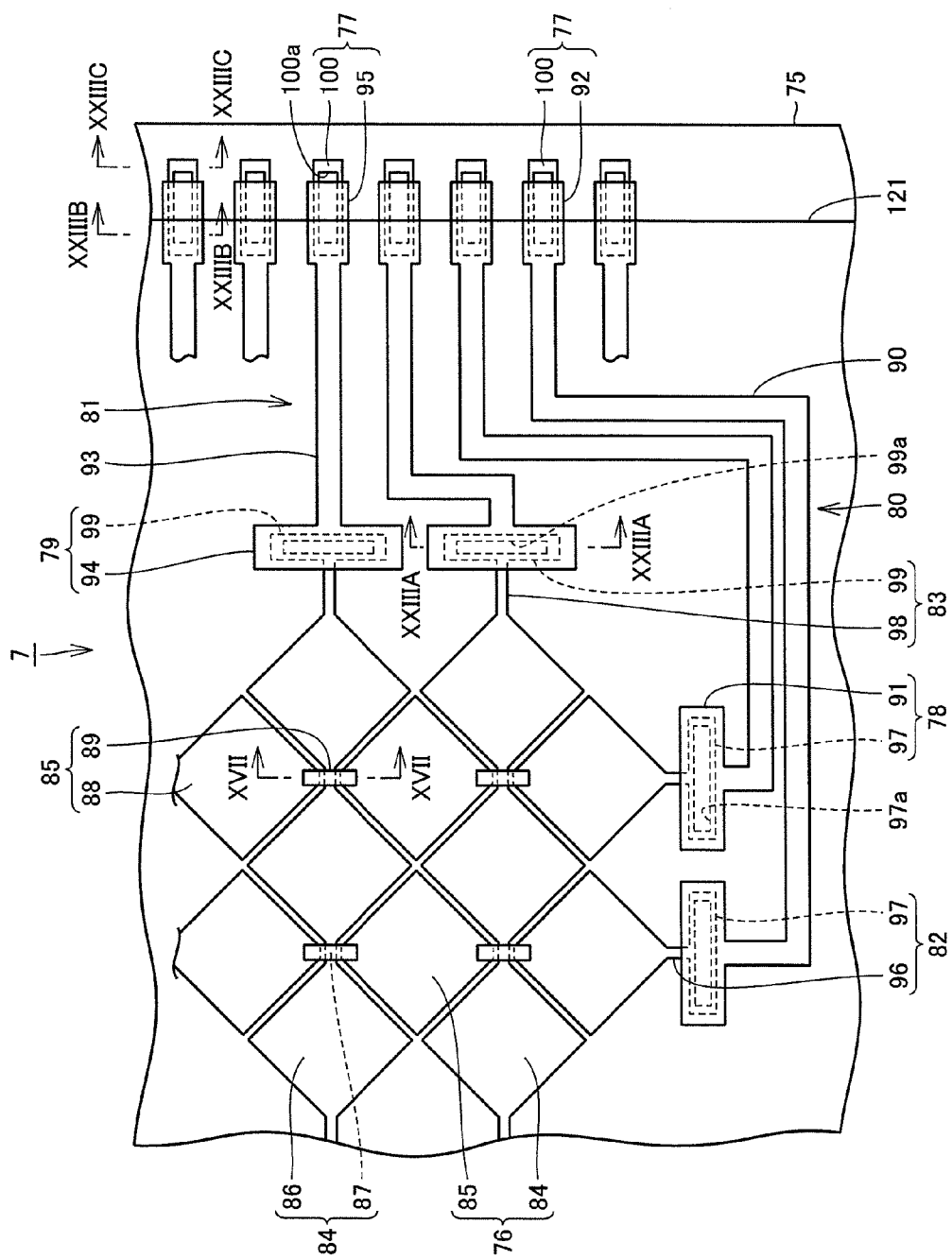
FIG. 12 is a plan view showing a touch panel 7.

A configuration of touch panel 7 will be described with reference to FIG. 12. FIG. 12 is a plan view showing touch panel 7. As shown in this FIG. 12, touch panel 7 includes a transparent substrate 75 having a main surface, a detection electrode 76 formed on the main surface of transparent substrate 75, a plurality of terminal portions 77 formed at an outer perimeter edge portion of transparent substrate 75, a plurality of connection portions 78 and 79, metal wirings 80 and 81, and transparent conductive wirings 82 and 83.

Detection electrode 76 includes a first array electrode 84 extending in the first direction and a second array electrode 85 extending in the second direction. A plurality of first array electrodes 84 are spaced apart from one another in the second direction, and a plurality of second array electrodes 85 are spaced apart from one another in the first direction.

Each of first array electrode 84 and second array electrode 85 is formed of a transparent conductive film such as an ITO film or an IZO film.

First array electrode 84 includes a plurality of electrode plates 86 formed on the main surface of transparent substrate 75 and spaced apart from one another in the first direction, and a connection piece 87 provided between electrode plates 86 and connecting electrode plates 86.

When electrode plate 86 is viewed from a direction perpendicular to the main surface of transparent substrate 75, electrode plate 86 is formed in the square shape. The shape of electrode plate 86 is not limited to the square shape. Electrode plate 86 may have the rectangular shape, the polygonal shape and the circular shape.

Connection piece 87 is formed on the main surface of transparent substrate 75 and connects apexes of adjacent electrode plates 86.

Second array electrode 85 includes a plurality of electrode plates 88 spaced apart from one another in the second direction, and a connection piece 89 connecting electrode plates 88. Electrode plate 88 is formed on the main surface of transparent substrate 75 and connection piece 89 is formed to straddle connection piece 87. An interlayer insulating film is formed between connection piece 89 and connection piece 87 to ensure the insulation property between connection piece 89 and connection piece 87.

Connection portion 78 is provided at one end of second array electrode 85, and connection portion 79 is provided at one end of first array electrode 84.

Metal wiring 80 is formed to connect connection portion 78 and terminal portion 77, and metal wiring 81 is formed to connect connection portion 79 and terminal portion 77.

Metal wiring 80 includes a wiring main body portion 90, a wide portion 91 provided at an end of wiring main body portion 90 on the connection portion 78 side, and a wide portion 92 provided at an end of wiring main body portion 90 on the terminal portion 77 side.

Metal wiring 81 includes a wiring main body portion 93, a wide portion 94 provided at an end of wiring main body portion 93 on the connection portion 79 side, and a wide portion 95 provided at an end of wiring main body portion 93 on the terminal portion 77 side.

Each of metal wiring 80 and metal wiring 81 is made of, for example, a metal material including at least one of titanium (Ti), molybdenum (Mo), tantalum (Ta), tungsten (W), and chromium (Cr) as a main ingredient.

Each of transparent conductive wiring 82 and transparent conductive wiring 83 is formed on the main surface of transparent substrate 75 and is formed of an ITO film or an IZO film.

Transparent conductive wiring 82 includes a wiring main body portion 96 connected to an end of second array electrode 85, and a wide portion 97 formed at an end of wiring main body portion 96.

Wide portion 97 is formed in the shape of a frame and a central portion of wide portion 97 has a hole 97a. The main surface of transparent substrate 75 is located at the bottom of hole 97*a*, and a part of the main surface of transparent substrate 75 is exposed from wide portion 97.

Transparent conductive wiring 83 includes a wiring main body 98 connected to an end of first array electrode 84, and a wide portion 99 formed at an end of wiring main body 98. Wide portion 99 is formed in the shape of a frame and wide portion 99 has a hole 99*a*.

The main surface of transparent substrate 75 is located at the bottom of hole 99*a*, and a part of the main surface of transparent substrate 75 is exposed from wide portion 99 by hole 99*a*.

Connection portion 78 is formed by wide portion 91 of metal wiring 80 and wide portion 97 of transparent conductive wiring 82. Connection portion 79 is formed by wide portion 94 of metal wiring 81 and wide portion 99 of transparent conductive wiring 83.

Terminal portion 77 includes a transparent conductive film 100 formed on the main surface of transparent substrate 75, and wide portion 92 or wide portion 95 formed to cover transparent conductive film 100. Transparent conductive film 100 is formed in the shape of a frame and is formed of, for example, an ITO film or an IZO film.

Figure 13:
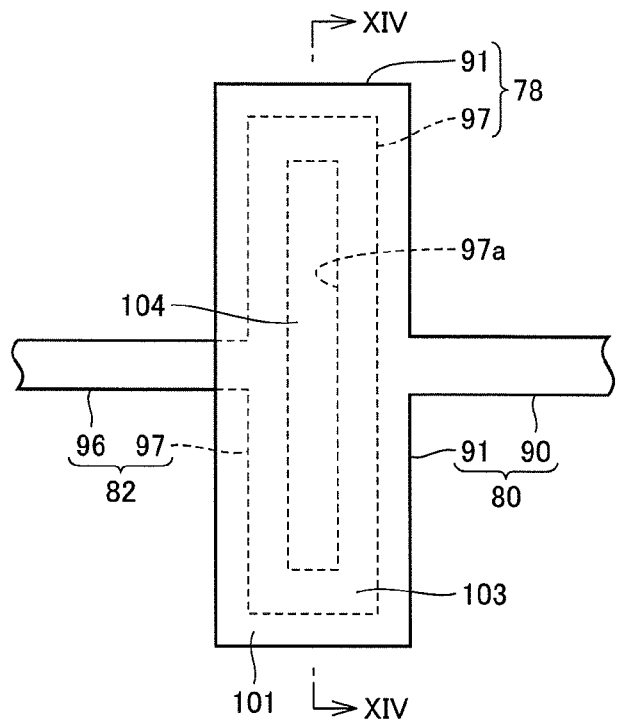
FIG. 13 is a plan view showing a connection portion 78.
Figure 14:
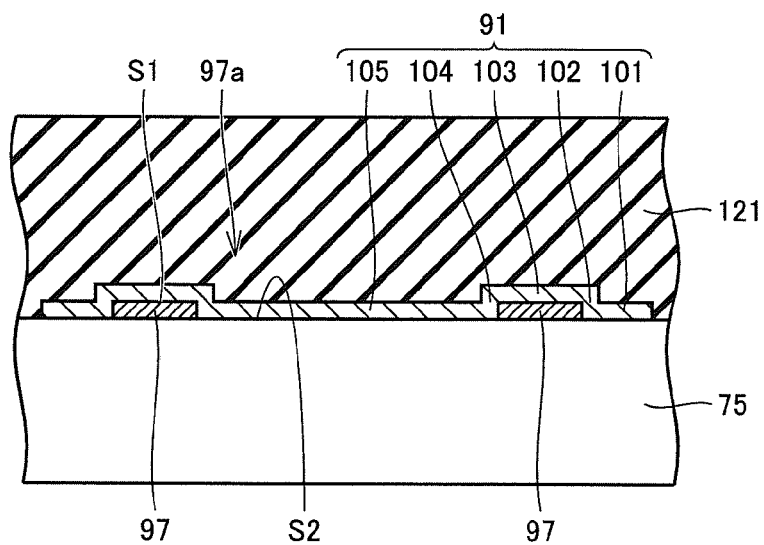
FIG. 14 is a cross-sectional view taken along line XIV-XIV shown in FIG. 13.

FIG. 13 is a plan view showing connection portion 78, and FIG. 14 is a cross-sectional view taken along line XIV-XIV shown in FIG. 13.

Referring to FIGS. 13 and 14, wide portion 91 includes an outer edge portion 101 formed on the main surface of transparent substrate 75 and extending along an outer perimeter of wide portion 97, an outer perimeter wall portion 102 formed on the outer perimeter of wide portion 97, an upper surface portion 103 formed on an upper surface of wide portion 97, an inner perimeter wall portion 104 formed on an inner perimeter surface of wide portion 97, and a closing portion 105 formed to cover the main surface of transparent substrate 75 exposed from hole 97*a*.

Outer edge portion 101 is annularly formed to surround wide portion 97 and is in contact with the main surface of transparent substrate 75. Closing portion 105 is in contact with the entire main surface of transparent substrate 75 exposed from hole 97*a*.

Outer perimeter wall portion 102, upper surface portion 103 and inner perimeter wall portion 104 are in contact with wide portion 97. Now, assume that a contact area S1 represents an area of a portion of wide portion 91 that is in contact with wide portion 97.

Also assume that a contact area S2 represents a contact area between wide portion 91 and the main surface of transparent substrate 75 exposed from hole 97*a*. Then, contact area S1 and contact area S2 satisfy the following equation (1):

$$(\text{contact area } S1) \times 1/5 < (\text{contact area } S2) \qquad (1).$$

By forming wide portion 97 to satisfy the relationship of the aforementioned equation (1), a contact area between wide portion 91 and the main surface of transparent substrate 75 can be widened.

As a result, even when wide portion 97 formed of a transparent conductive film is corroded and the adhesion between wide portion 97 and wide portion 91 decreases, peel-off of wide portion 91 from transparent substrate 75 can be suppressed.

Assume that an area S3 represents an area of a portion of a surface of wide portion 97 that is not in contact with transparent substrate 75, and an area S4 represents an area of a portion of the main surface of transparent substrate 75 located in hole 97*a*. Then, area S3 and area S4 satisfy the following equation (2):

$$(\text{area } S3) \times 1/5 < (\text{area } S4) \qquad (2).$$

Wide portion 91 is formed to extend from the main surface of transparent substrate 75 located at the outer perimeter of wide portion 97 onto wide portion 97 and further onto the main surface of transparent substrate 75 located inside frame-shaped wide portion 97.

As described above, wide portion 91 is formed to cover wide portion 97, and thus, even when the adhesion between wide portion 97 and transparent substrate 75 decreases, wide portion 97 can be pressed against transparent substrate 75. As a result, peel-off of wide portion 97 from transparent substrate 75 can be suppressed.

Figure 15:
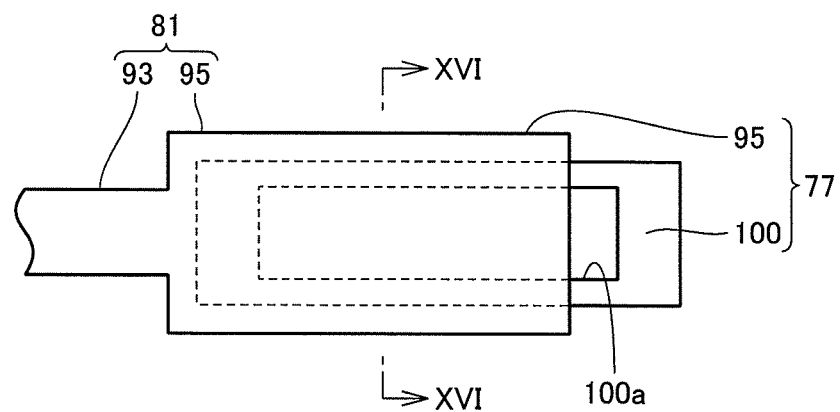
FIG. 15 is a plan view showing a terminal portion 77.
Figure 16:
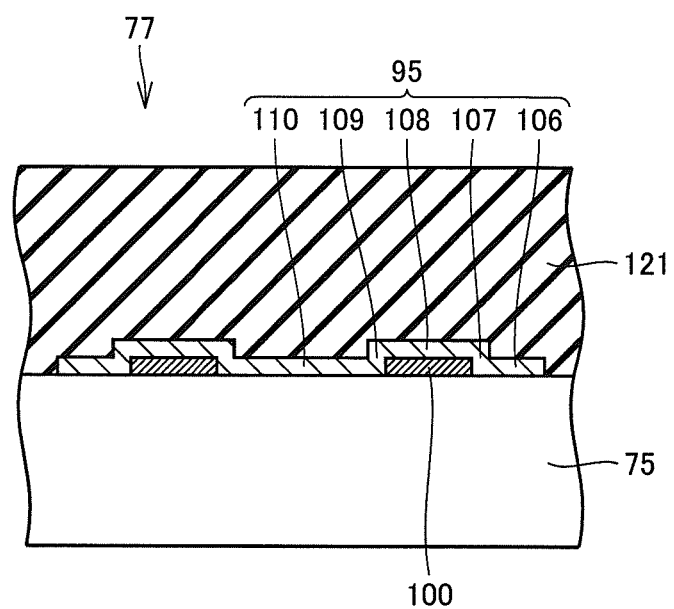
FIG. 16 is a cross-sectional view taken along line XVI-XVI shown in FIG. 15.

FIG. 15 is a plan view showing terminal portion 77, and FIG. 16 is a cross-sectional view taken along line XVI-XVI shown in FIG. 15.

As shown in FIGS. 15 and 16, terminal portion 77 includes transparent conductive film 100 formed in the shape of a frame, and wide portion 95 formed to cover more than a half of transparent conductive film 100.

Transparent conductive film 100 has a hole 100*a* and a part of the main surface of transparent substrate 75 is exposed from hole 100*a* of transparent conductive film 100.

Wide portion 95 includes an outer edge portion 106 formed on the main surface of transparent substrate 75 along an outer perimeter of outer edge portion 101, an outer perimeter wall portion 107 formed on an outer perimeter surface of transparent conductive film 100, an upper surface portion 108 formed on an upper surface of transparent conductive film 100, an inner perimeter wall portion 109 formed on an inner perimeter wall of transparent conductive film 100, and a closing portion 110 formed on the main surface of transparent substrate 75 located in hole 100*a*.

More than a half of a portion of transparent conductive film 100 exposed from transparent substrate 75 is covered by wide portion 95.

Therefore, even when the adhesion between transparent conductive film 100 and transparent substrate 75 decreases, wide portion 95 can press transparent conductive film 100 against transparent substrate 75 and peel-off of transparent conductive film 100 from transparent substrate 75 can be suppressed.

Now, assume that a contact area S5 represents a contact area between wide portion 95 and transparent conductive film 100. Furthermore, assume that a contact area S6 represents a contact area between wide portion 95 and a portion of the main surface of transparent substrate 75 exposed from hole 100*a*. Then, contact area S5 and contact area S6 satisfy a relational expression indicated by the following equation (3):

$$(\text{contact area } S5) \times 1/5 < (\text{contact area } S6) \qquad (3).$$

As a result, a contact area between wide portion 95 and the main surface of transparent substrate 75 is ensured and peel-off of wide portion 95 from transparent substrate 75 is suppressed. Furthermore, wide portion 95 can press transparent conductive film 100 against transparent substrate 75 and peel-off of transparent conductive film 100 from transparent substrate 75 can be suppressed.

Assume that an area S7 represents an area of a portion of a surface of wide portion 95 that is not in contact with transparent substrate 75. Assume that an area S8 represents an area of the portion of the main surface of transparent substrate 75 exposed from hole 100*a*. Then, area S7 and area S8 satisfy a relational expression indicated by the following equation (4):

$$(\text{area } S7) \times 1/5 < (\text{area } S8) \qquad (4).$$

As described above, in image display device 1 according to this first embodiment, peel-off of the transparent conductive film can be suppressed in the terminal portion and the connection portion provided in parallax barrier substrate 6 and touch panel 7.

Figure 17:
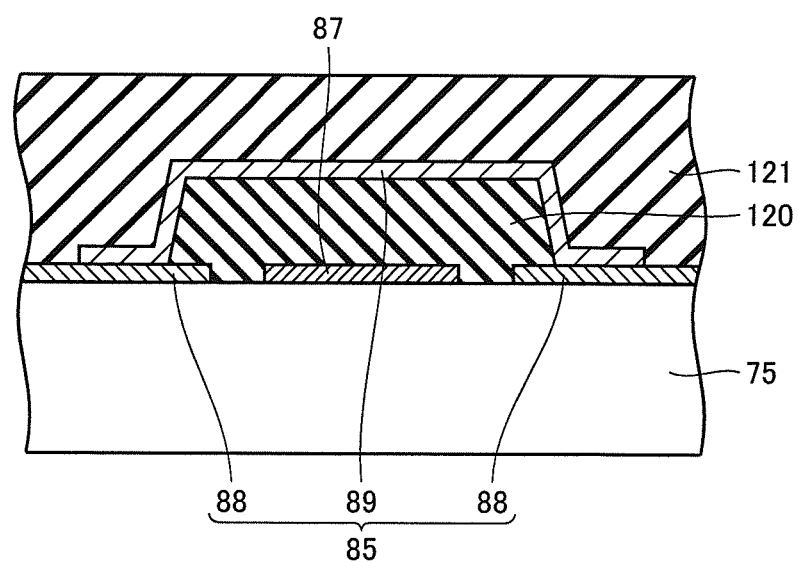
FIG. 17 is a cross-sectional view showing a connection piece 89 and taken along line XVII-XVII shown in FIG. 12.

FIG. 17 is a cross-sectional view showing connection piece 89 and taken along line XVII-XVII shown in FIG. 12.

As shown in this FIG. 17, transparent substrate 75 includes, on the main surface, the plurality of electrode plates 88 spaced apart from one another, connection piece 87 formed on the main surface of transparent substrate 75 to pass between electrode plates 88, an interlayer insulating film 120 formed to cover connection piece 87, connection piece 89 formed on this interlayer insulating film 120, and a protection film 121 formed to cover connection piece 89 and electrode plates 88.

Connection piece 89 is formed to connect adjacent electrode plates 88 and is formed of, for example, a transparent conductive film such as an ITO film.

Interlayer insulating film 120 is formed of, for example, an inorganic insulating film such as an SiN film. Protection film 121 includes, for example, an inorganic insulating film such as an SiN film, and an organic insulating film formed on this inorganic insulating film and made of an acrylic-based resin and the like.

As is clear from FIG. 12, protection film 121 is formed to completely cover detection electrode 76 and connection portion 79 and to cover at least a part of terminal portion 77.

Image display device 1 configured as described above is manufactured by separately manufacturing backlight unit 3, liquid crystal display panel 4, spacer 5, parallax barrier substrate 6, and touch panel 7, and thereafter, stacking backlight unit 3, liquid crystal display panel 4, spacer 5, parallax barrier substrate 6, and touch panel 7 and containing backlight unit 3, liquid crystal display panel 4, spacer 5, parallax barrier substrate 6, and touch panel 7 in housing 2. Thus, a method for manufacturing parallax barrier substrate 6 and a method for manufacturing touch panel 7 will be described.

First, the method for manufacturing parallax barrier substrate 6 will be described with reference to FIGS. 18 and 19.

At the time of fabricating parallax barrier substrate 6, first substrate 15 shown in FIG. 2 and second substrate 16 shown in FIG. 7 are fabricated, and thereafter, a liquid crystal is dropped onto one of first substrate 15 and second substrate 16. Thereafter, first substrate 15 and second substrate 16 are bonded together, and further, sealing is performed to seal the liquid crystal layer.

Figure 18:
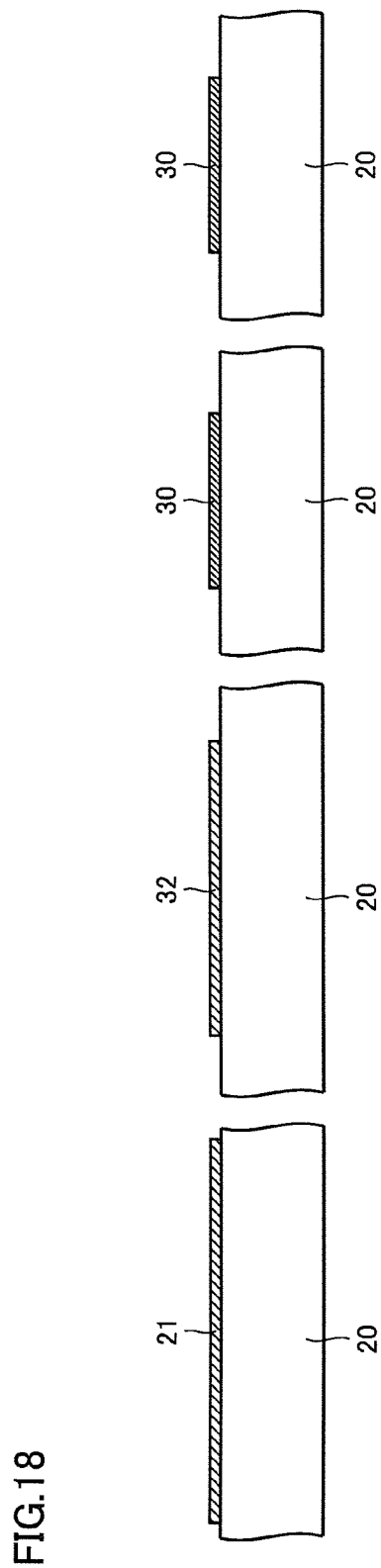
FIG. 18 is a cross-sectional view showing a first step of a process for manufacturing first substrate 15 shown in FIG. 2.
Figure 19:
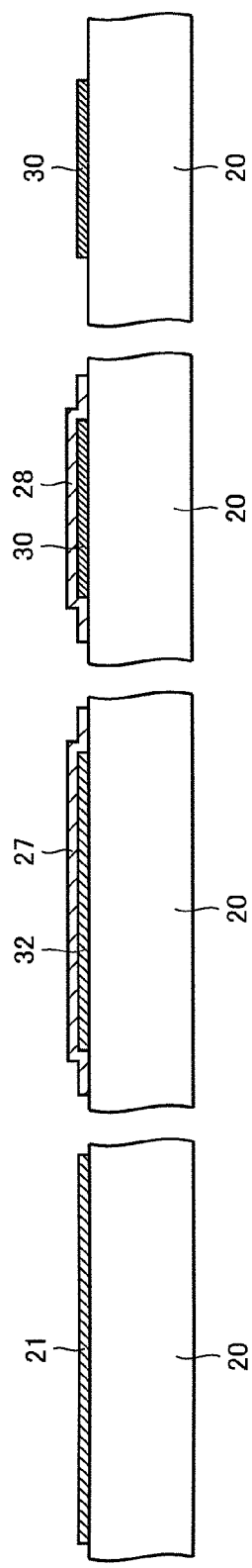
FIG. 19 is a cross-sectional view showing a manufacturing step after the manufacturing step shown in FIG. 18.

FIG. 18 is a cross-sectional view showing a first step of a process for manufacturing first substrate 15 shown in FIG. 2, and FIG. 19 is a cross-sectional view showing a manufacturing step after the manufacturing step shown in FIG. 18.

Cross-sectional views at four positions are shown in each of FIGS. 18 and 19. Of these four cross-sectional views, the cross-sectional view located at the leftmost position is a cross-sectional view of a portion corresponding to a position indicated by line XVIIIA-XVIIIA shown in FIG. 2. The cross-sectional view located at the second-leftmost position is a cross-sectional view at a position corresponding to line XVIIIB-XVIIIB shown in FIG. 2.

The cross-sectional view located at the third-leftmost position is a cross-sectional view at a position corresponding to line XVIIIC-XVIIIC shown in FIG. 2. The cross-sectional view located at the fourth-leftmost position is a cross-sectional view at a position corresponding to line XVIIID-XVIIID shown in FIG. 2.

First, referring to FIG. 18, transparent substrate 20 having the main surface is prepared. Thereafter, the ITO film is formed on the main surface of transparent substrate 20. Thereafter, the ITO film is patterned, and thereby, first transparent electrode 21, wide portion 32 and transparent conductive film 30 are formed on the main surface of transparent substrate 20. At this time, wiring main body portion 31 shown in FIG. 2 is also formed.

The metal film is deposited by sputtering on the main surface of transparent substrate 20 having first transparent electrode 21, wide portion 32, transparent conductive film 30 and the like formed thereon. A metal material forming this metal film includes at least one of titanium (Ti), molybdenum (Mo), tantalum (Ta), tungsten (W), and chromium (Cr) as a main ingredient.

Thereafter, as shown in FIG. 19, the aforementioned metal film is patterned. As a result, wide portion 27 formed to cover wide portion 32 and wide portion 28 formed to cover transparent conductive film 30 are formed. In this step, metal wiring 23 shown in FIG. 2 is formed. First substrate 15 shown in FIG. 2 is thus fabricated.

Second substrate 16 shown in FIG. 7 is fabricated by the manufacturing process that is substantially the same as that of first substrate 15.

For example, the process for manufacturing second substrate 16 includes the steps of: preparing transparent substrate 50 having the main surface; forming the transparent conductive film on the main surface of transparent substrate 50; patterning the aforementioned transparent conductive film and forming second transparent electrode 51, transparent conductive wiring 54 and transparent conductive film 61; forming second transparent electrode 51 and transparent conductive wiring 54, and thereafter, forming the metal film on the main surface of transparent substrate 50; and patterning this metal film and forming metal wiring 53.

An ITO film, an IZO film and the like are used as the aforementioned transparent conductive film. The metal film is made of, for example, a metal material including at least one of titanium (Ti), molybdenum (Mo), tantalum (Ta), tungsten (W), and chromium (Cr) as a main ingredient.

Next, the method for manufacturing touch panel 7 shown in FIG. 12 will be described with reference to FIGS. 20 to 24. Four cross-sectional views at different positions are shown in each of FIGS. 20 to 24.

Of the four cross-sectional views shown in each of FIGS. 20 to 24, the cross-sectional view located at the leftmost position is a cross-sectional view at a position corresponding to line XVII-XVII shown in FIG. 12.

The cross-sectional view located at the second-leftmost position is a cross-sectional view at a position corresponding to line XXIIIA-XXIIIA. The cross-sectional view located at the third-leftmost position is a cross-sectional view at a position corresponding to line XXIIIB-XXIIIB. The cross-sectional view located at the fourth-leftmost position is a cross-sectional view at a position corresponding to line XXIIIC-XXIIIC.

Figure 20:
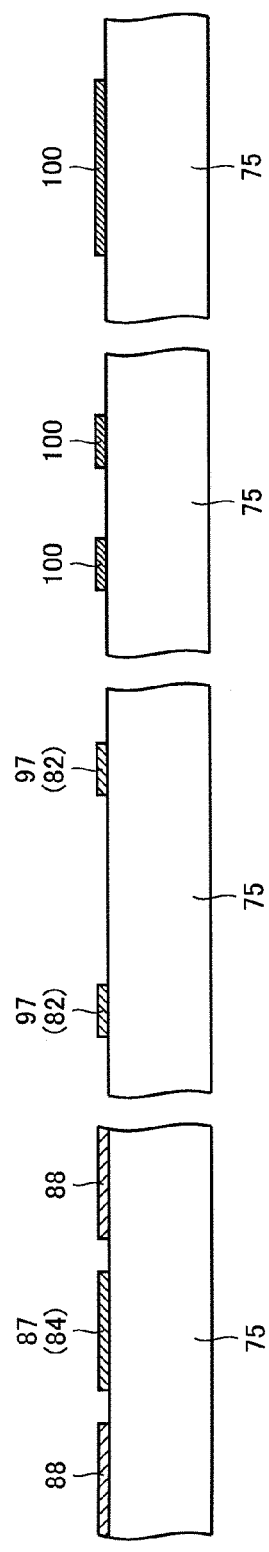
FIG. 20 is a cross-sectional view showing a first step of a process for manufacturing touch panel 7.

FIG. 20 is a cross-sectional view showing a first step of the process for manufacturing touch panel 7. Referring to this FIG. 20, transparent substrate 75 having the main surface is prepared.

Thereafter, the transparent conductive film such as an ITO film or an IZO film is deposited on the main surface of transparent substrate 75, and thereafter, this transparent conductive film is patterned.

As a result, the plurality of electrode plates 88, first array electrode 84, transparent conductive wiring 82, and transparent conductive film 100 are formed. Transparent conductive wiring 83 shown in FIG. 12 is also formed.

Figure 21:
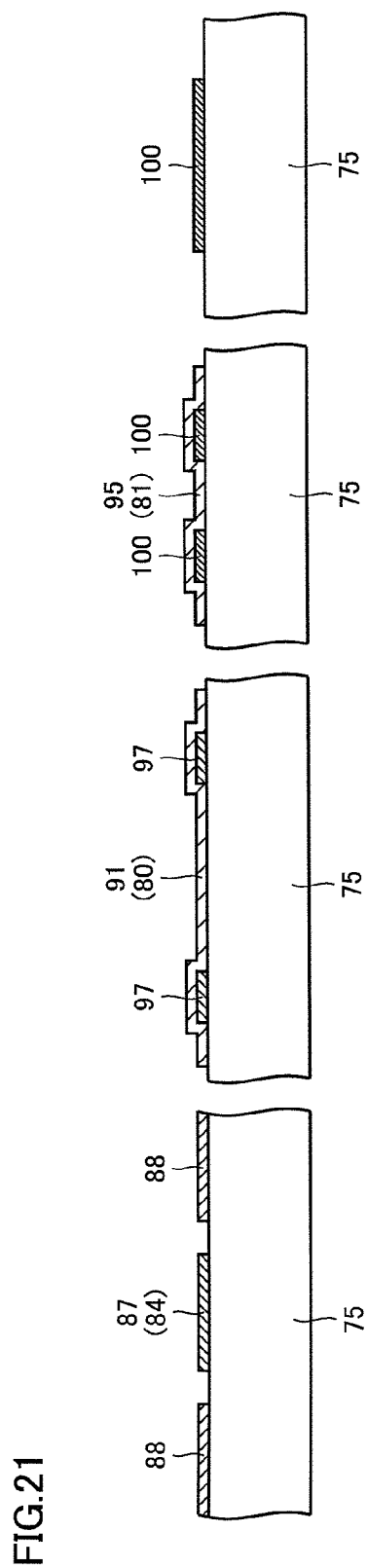
FIG. 21 is a cross-sectional view showing a step after the manufacturing step shown in FIG. 20.

Next, referring to FIG. 21, the metal film is formed on the main surface of transparent substrate 75 to cover the plurality of electrode plates 88, first array electrode 84, transparent conductive wiring 82, transparent conductive wiring 83, and transparent conductive film 100. This metal film includes at least one of titanium (Ti), molybdenum (Mo), tantalum (Ta), tungsten (W), and chromium (Cr) as a main ingredient.

Then, this metal film is patterned, and thereby, metal wiring 80 and metal wiring 81 are formed.

Figure 22:
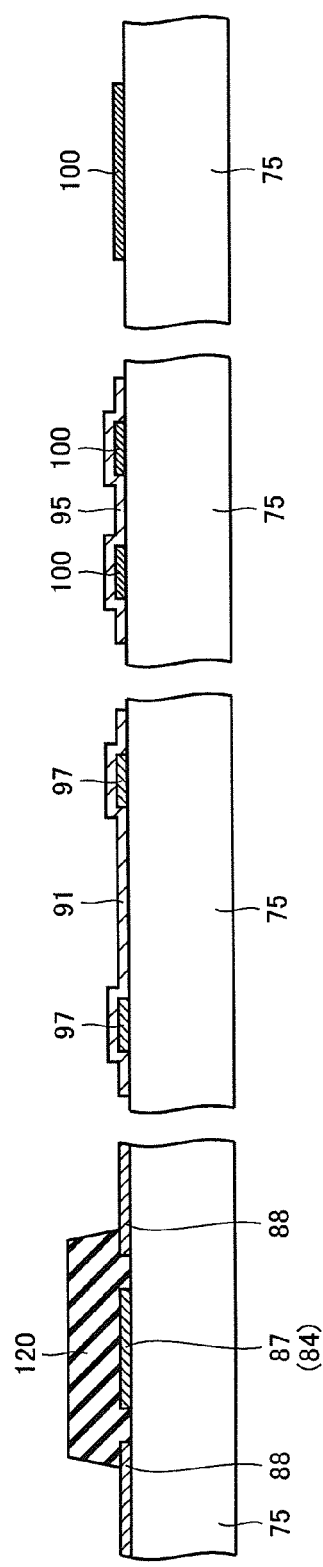
FIG. 22 is a cross-sectional view showing a step after the manufacturing step shown in FIG. 21.

Next, referring to FIG. 22, the inorganic insulating film such as an SiN film is deposited to cover electrode plates 88, first array electrode 84, metal wiring 80, metal wiring 81, and transparent conductive film 100. Thereafter, this inorganic insulating film is patterned, and thereby, interlayer insulating film 120 is formed.

As a result, electrode plates 88, metal wiring 80, metal wiring 81, and transparent conductive film 100 are exposed from the aforementioned inorganic insulating film.

Figure 23:
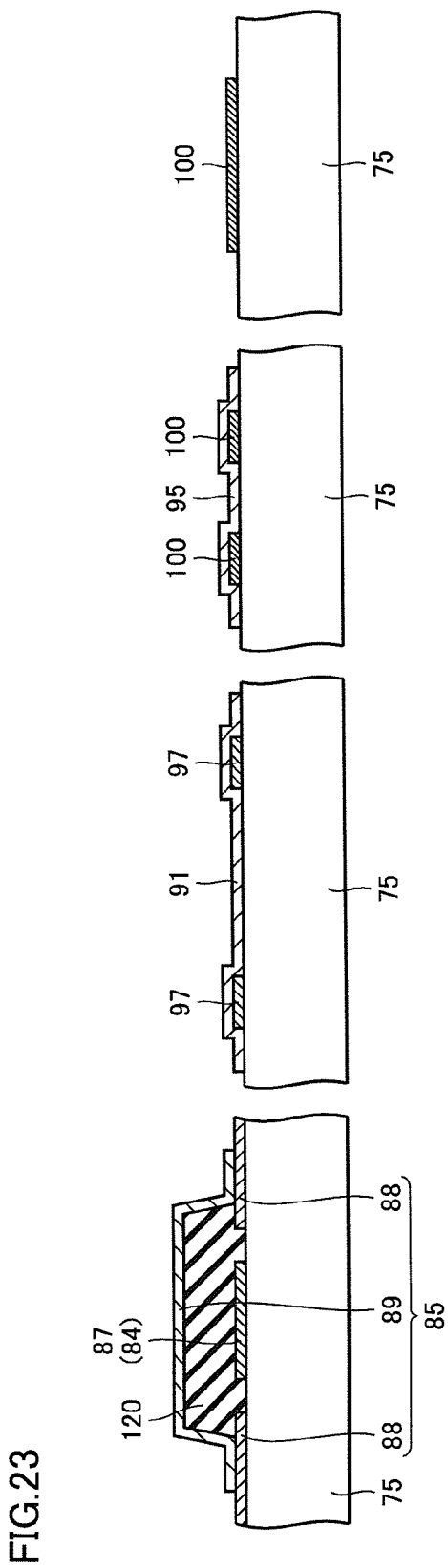
FIG. 23 is a cross-sectional view showing a step after the manufacturing step shown in FIG. 22.

Next, referring to FIG. 23, the ITO film is deposited. Thereafter, this ITO film is patterned, and thereby, connection piece 89 is formed. Second array electrode 85 is thus formed.

Figure 24:
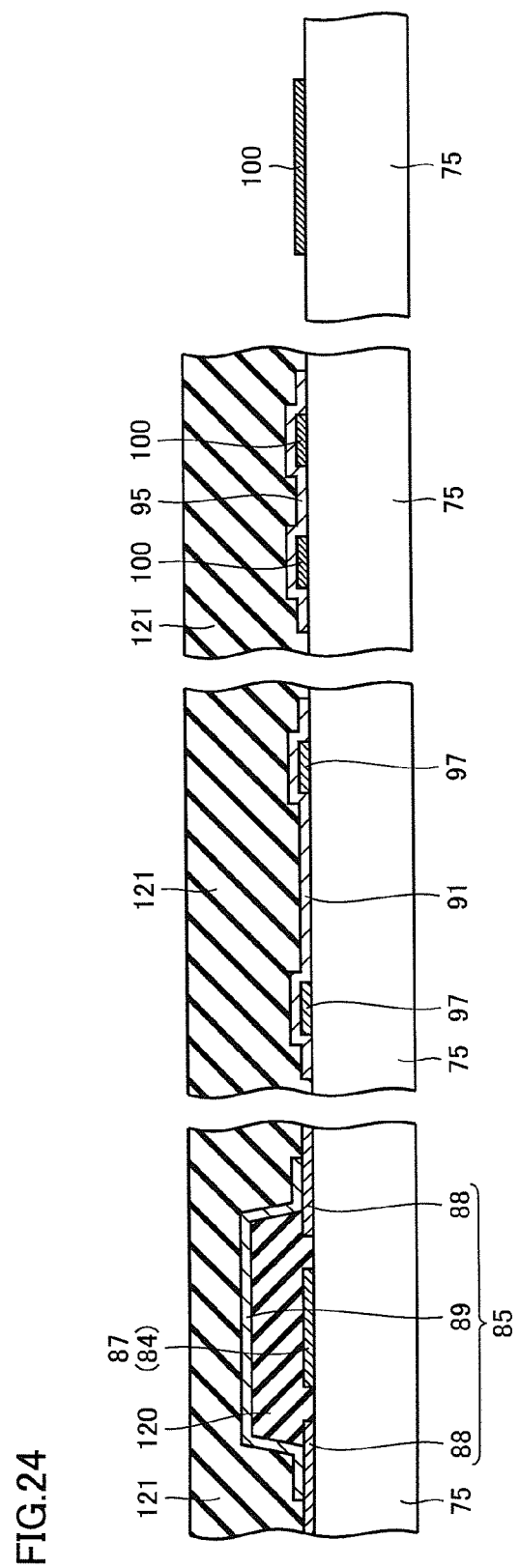
FIG. 24 is a cross-sectional view showing a step after the manufacturing step shown in FIG. 23.

Next, referring to FIG. 24, the inorganic insulating film such as an SiN film and the acrylic-based organic insulating film are sequentially stacked.

Thereafter, the acrylic-based organic insulating film is first patterned. Then, the inorganic insulating film is formed by using the patterned organic insulating film as a mask. As a result, protection film 121 is formed. Touch panel 7 shown in FIG. 12 can thus be fabricated.

After parallax barrier substrate 6 and touch panel 7 are fabricated as described above, backlight unit 3, liquid crystal display panel 4, spacer 5, parallax barrier substrate 6, and touch panel 7 are assembled in housing 2 as described above. Image display device 1 can thus be fabricated.

Second Embodiment

An image display device according to a second embodiment will be described with reference to FIGS. 25 to 35. Components shown in FIGS. 25 to 35 that are the same as or corresponding to the components shown in FIGS. 1 to 24 above are denoted by the same reference characters and description thereof will not be repeated.

Figure 25:
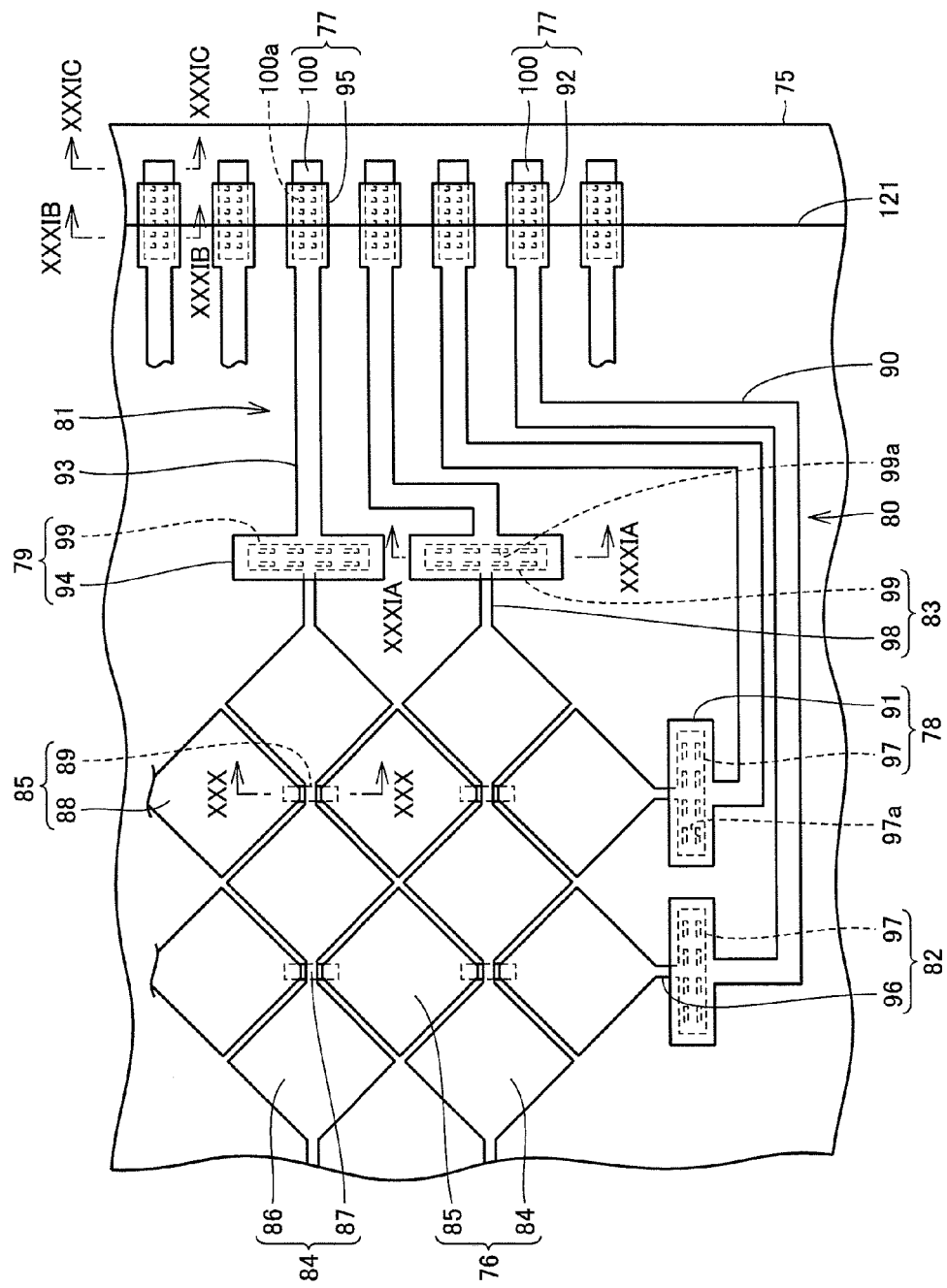
FIG. 25 is a plan view showing touch panel 7 mounted on an image display device according to a second embodiment.

FIG. 25 is a plan view showing touch panel 7 mounted on the image display device according to this second embodiment.

In an example shown in this FIG. 25, touch panel 7 includes touch panel transparent substrate 75, detection electrode 76 including first array electrode 84 and second array electrode 85, the plurality of terminal portions 77 provided at the outer perimeter of transparent substrate 75 and arranged along the outer perimeter, connection portion 78 provided at one end of second array electrode 85, and connection portion 79 provided at one end of first array electrode 84.

Touch panel 7 also includes metal wiring 81 extending between terminal portion 77 and connection portion 79, and metal wiring 80 extending between connection portion 78 and terminal portion 77. Metal wiring 80 includes wiring main body portion 90, wide portion 91 formed at one end of wiring main body portion 90, and wide portion 92 formed at the other end of wiring main body portion 90. Metal wiring 81 includes wiring main body portion 93, wide portion 94 formed at one end of wiring main body portion 93, and wide portion 95 formed at the other end of wiring main body portion 93.

Transparent conductive wiring 82 includes wiring main body portion 96 connected to the end of second array electrode 85, and wide portion 97 formed at the end of wiring main body portion 96. Transparent conductive wiring 83 includes wiring main body 98 connected to the end of first array electrode 84, and wide portion 99 formed at the end of this wiring main body 98.

Connection portion 78 is formed by wide portion 97 of transparent conductive wiring 82 and wide portion 91 of metal wiring 80, and wide portion 91 is formed to cover wide portion 97.

Connection portion 79 is formed by wide portion 99 of transparent conductive wiring 83 and wide portion 94 of metal wiring 81, and wide portion 94 is formed to cover wide portion 99.

Terminal portion 77 is formed by transparent conductive film 100 formed on the main surface of transparent substrate 75 and wide portions 92 and 95 of metal wirings 80 and 81, and wide portions 92 and 95 are formed to cover at least a part of transparent conductive film 100.

Figure 26:
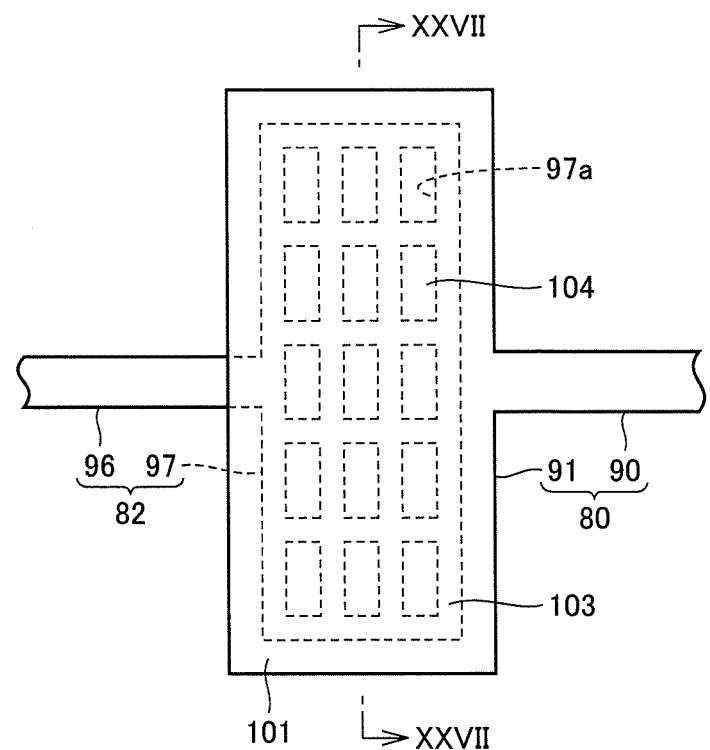
FIG. 26 is a plan view showing a detail of connection portion 78.

FIG. 26 is a plan view showing a detail of connection portion 78. As shown in this FIG. 26, wide portion 97 has a plurality of holes 97a. Wide portion 91 is formed to cover the entire upper surface of wide portion 97.

Figure 27:
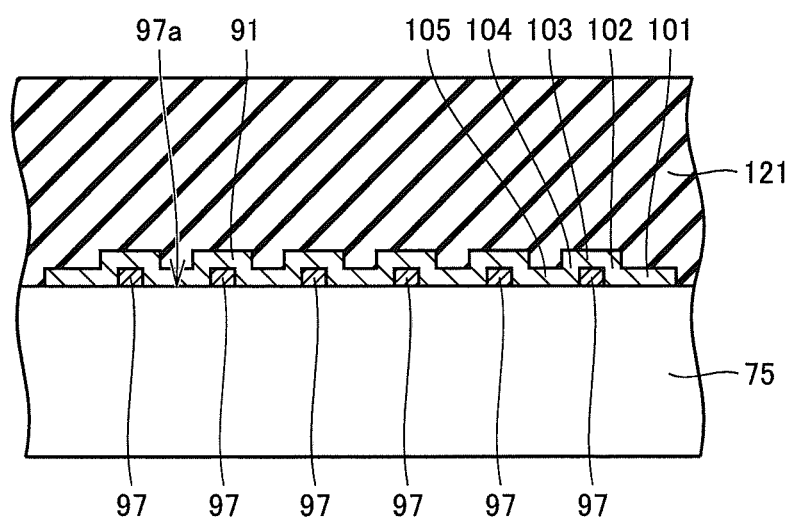
FIG. 27 is a cross-sectional view taken along line XXVII-XXVII shown in FIG. 26.

FIG. 27 is a cross-sectional view taken along line XXVII-XXVII shown in FIG. 26. As shown in this FIG. 27, wide portion 91 includes outer edge portion 101 formed on a portion of the main surface of transparent substrate 75 adjacent to the outer perimeter of wide portion 97, outer perimeter wall portion 102 formed on the outer perimeter surface of wide portion 97, upper surface portion 103 formed on the upper surface of wide portion 97, inner perimeter wall portion 104 formed on the inner perimeter surface of wide portion 97, and closing portion 105 formed on a portion of the main surface of transparent substrate 75 exposed from hole 97a.

Outer edge portion 101 is annularly formed and outer edge portion 101 is formed to surround wide portion 97. Wide portion 97 has the plurality of holes 97a and closing portion 105 is provided for each hole 97a.

Wide portion 91 is in contact with the main surface of transparent substrate 75 in annularly extending outer edge portion 101 and closing portion 105, and thus, peel-off of wide portion 91 from the main surface of transparent substrate 75 is suppressed. On the other hand, wide portion 97 and wide portion 91 are in contact with each other in outer perimeter wall portion 102, upper surface portion 103 and inner perimeter wall portion 104.

Now, assume that a contact area S9 represents a contact area between wide portion 91 and wide portion 97, and a contact area S10 represents a contact area between wide portion 91 and transparent substrate 75. Then, contact area S9 and contact area S10 satisfy a relationship indicated by the following equation (5):

$$(\text{contact area } S9) \times \frac{1}{5} < (\text{contact area } S10) \tag{5}$$

As a result, even when the transparent conductive film such as an ITO film and an IZO film that forms wide portion 97 is corroded, peel-off of wide portion 91 from the main surface of transparent substrate 75 can be suppressed.

Figure 28:
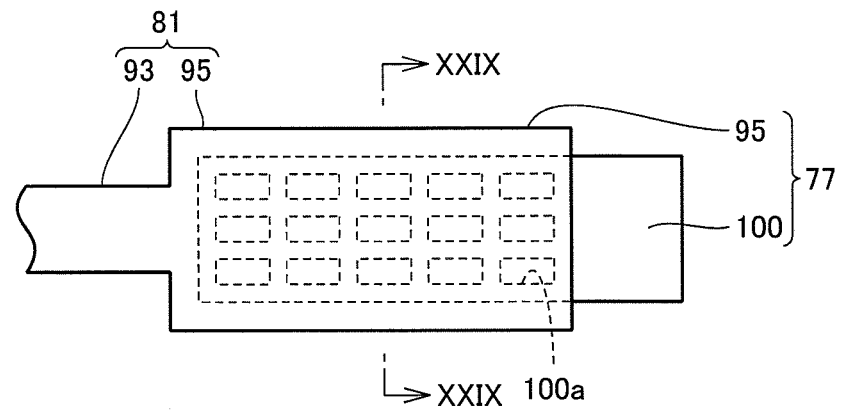
FIG. 28 is a plan view showing terminal portion 77.

FIG. 28 is a plan view showing terminal portion 77. As shown in this FIG. 28, wide portion 95 of metal wiring 81 is formed to cover a part of transparent conductive film 100. Transparent conductive film 100 also has a plurality of holes 100a.

In an example shown in this FIG. 28, holes 100a are formed in a portion covered by wide portion 95.

Figure 29:
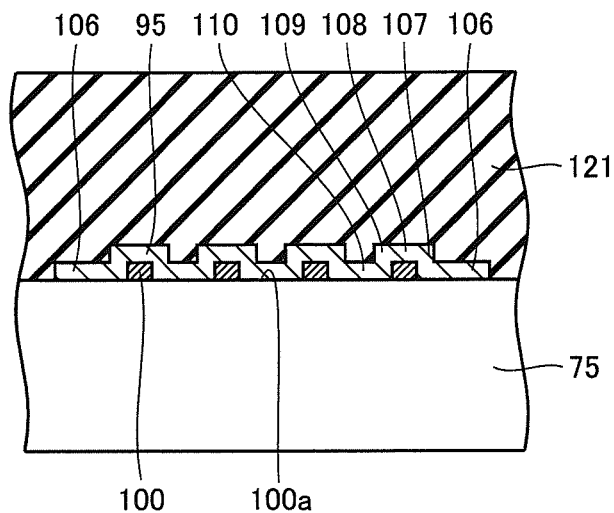
FIG. 29 is a cross-sectional view taken along line XXIX-XXIX shown in FIG. 28.

FIG. 29 is a cross-sectional view taken along line XXIX-XXIX shown in FIG. 28. As shown in this FIG. 29, wide portion 95 includes outer edge portion 106 formed on the main surface of transparent substrate 75 to surround transparent conductive film 100, outer perimeter wall portion 107 formed on the outer perimeter surface of transparent conductive film 100, upper surface portion 108 formed on the upper surface of transparent conductive film 100, inner perimeter wall portion 109 formed on the inner perimeter surface of transparent conductive film 100, and closing portion 110 that is in contact with a portion of the main surface of transparent substrate 75 located in hole 100a. This wide portion 95 is formed to cover more than a half of the upper surface of transparent conductive film 100.

Wide portion 95 is in contact with the main surface of transparent substrate 75 in outer edge portion 106 and closing portion 110. Wide portion 95 is in contact with transparent conductive film 100 in outer perimeter wall portion 107, upper surface portion 108 and inner perimeter wall portion 109.

Now, assume that a contact area S11 represents a contact area between wide portion 95 and the main surface of transparent substrate 75, and a contact area S12 represents a contact area between transparent conductive film 100 and wide portion 95. Then, contact area S11 and contact area S12 satisfy a relational expression indicated by the following equation (6):

(contact area $S11$)×$\frac{1}{5}$<(contact area $S12$)  (6).

As a result, even when the ITO film or the IZO film forming transparent conductive film 100 is corroded, peel-off of wide portion 95 from transparent substrate 75 can be suppressed.

Figure 30:
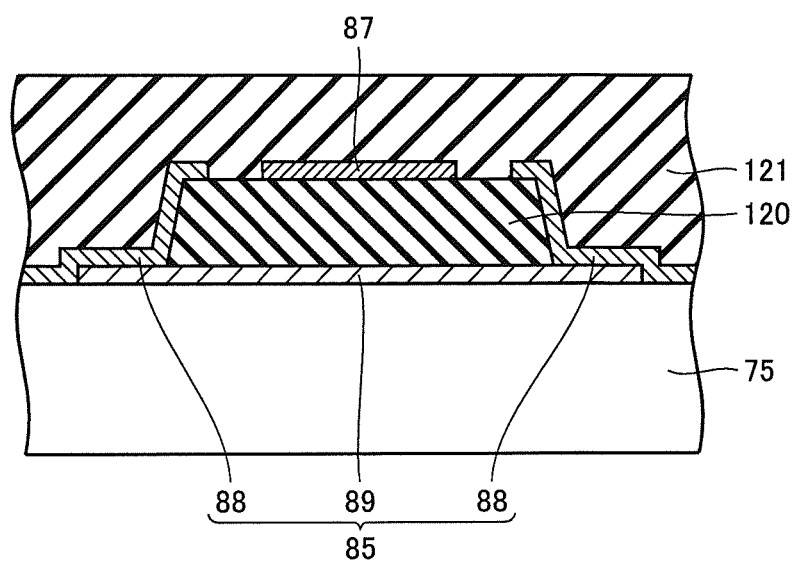
FIG. 30 is a cross-sectional view taken along line XXX-XXX shown in FIG. 25.

FIG. 30 is a cross-sectional view taken along line XXX-XXX shown in FIG. 25. As shown in this FIG. 30, second array electrode 85 includes the plurality of electrode plates 88 formed on the main surface of transparent substrate 75 and spaced apart from one another, and connection piece 89 formed to connect ends of electrode plates 88.

Referring to FIGS. 25 and 30, first array electrode 84 includes the plurality of electrode plates 86 spaced apart from one another, and connection piece 87 connecting ends of electrode plates 86. Referring to FIG. 30, interlayer insulating film 120 made of an inorganic material such as SiN is formed on an upper surface of connection piece 89, and connection piece 87 is formed on interlayer insulating film 120.

A method for manufacturing touch panel 7 thus formed will be described with reference to FIGS. 31 to 35.

Each of FIGS. 31 to 35 includes a plurality of cross-sectional views at different positions.

In each of FIGS. 31 to 35, the cross section view located at the leftmost position is a cross-sectional view at a position corresponding to line XXX-XXX in FIG. 25. The cross section view located at the second-leftmost position is a cross-sectional view taken along line XXXIA-XXXIA.

The cross-sectional view located at the third-leftmost position is a cross-sectional view at a position corresponding to line XXXIB-XXXIB shown in FIG. 25. The cross-sectional view located at the fourth-leftmost position is a cross-sectional view at a position corresponding to line XXXIC-XXXIC shown in FIG. 25.

Figure 31:
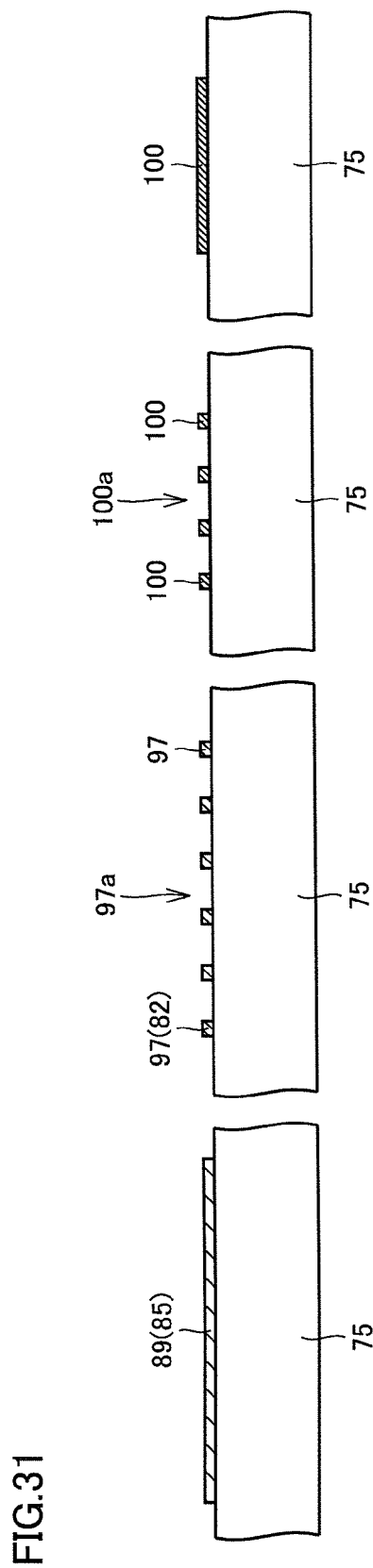
FIG. 31 is a cross-sectional view showing a first step of a process for manufacturing touch panel 7.

FIG. 31 is a cross-sectional view showing a first step of the method for manufacturing touch panel 7. Referring to this FIG. 31, transparent substrate 75 having the main surface is prepared.

Thereafter, the transparent conductive film such as an ITO film or an IZO film is formed on the main surface of transparent substrate 75. Thereafter, this transparent conductive film is patterned, and thereby, connection piece 89 is formed. At this time, transparent conductive wiring 82 and transparent conductive wiring 83 shown in FIG. 25 are formed. At this time, holes 97a are formed in wide portion 97 of transparent conductive wiring 82, and the plurality of holes 99a are also formed in wide portion 99 of transparent conductive wiring 83.

In addition, transparent conductive film 100 is formed at the outer perimeter edge portion of transparent substrate 75. Holes 100a are also formed in this transparent conductive film 100.

Figure 32:
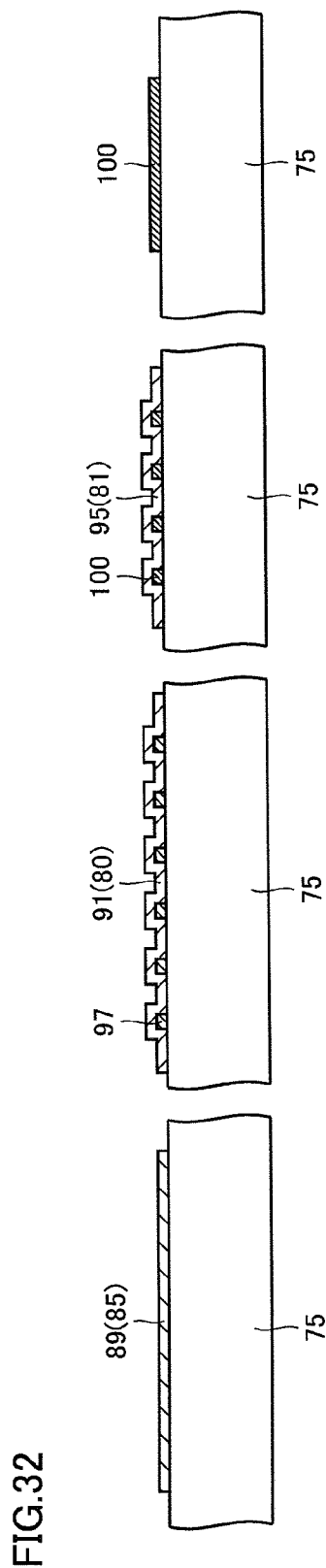
FIG. 32 is a cross-sectional view showing a step after the manufacturing step shown in FIG. 31.

FIG. 32 is a cross-sectional view showing a step after the manufacturing step shown in FIG. 31. Referring to this FIG. 32, the metal film is deposited on the main surface of transparent substrate 75 having connection piece 89, transparent conductive film 100, and transparent conductive wirings 82 and 83 formed thereon. Thereafter, this metal film is patterned.

As a result, the metal film located on the upper surfaces of second array electrode 85 and located around second array electrode 85 is removed. On the other hand, metal wiring 80 and metal wiring 81 are formed. Referring to FIG. 25, connection portion 78 and connection portion 79 are also formed. A part of transparent conductive film 100 is exposed from the aforementioned metal film.

Figure 33:
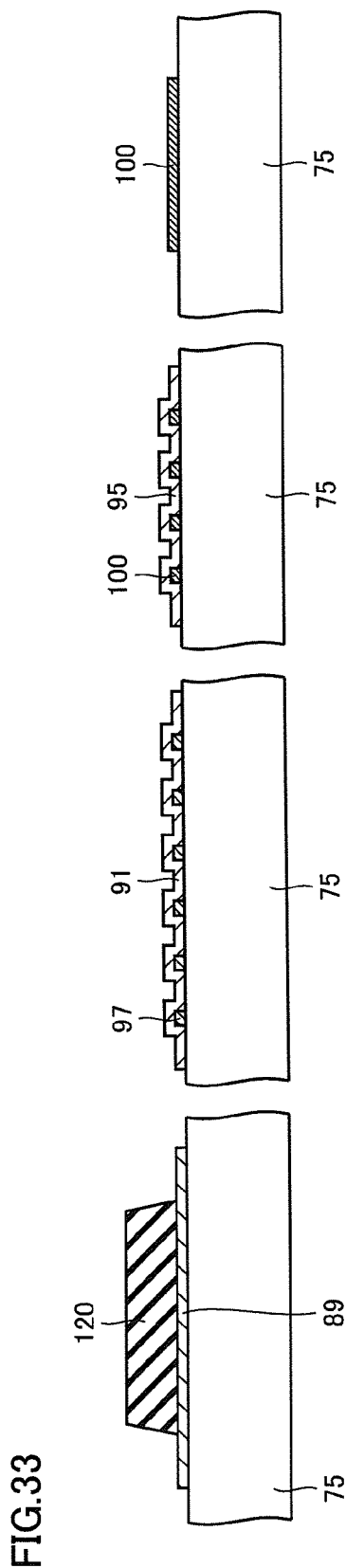
FIG. 33 is a cross-sectional view showing a step after the manufacturing step shown in FIG. 32.

FIG. 33 is a cross-sectional view showing a step after the manufacturing step shown in FIG. 32. Referring to this FIG. 33, the inorganic insulating film such as an SiN film is formed on the main surface of transparent substrate 75 to cover second array electrode 85, metal wirings 80 and 81, and the like.

Thereafter, this inorganic insulating film is patterned, and thereby, interlayer insulating film 120 is formed. The inorganic insulating film other than interlayer insulating film 120 is removed by this patterning.

Figure 34:
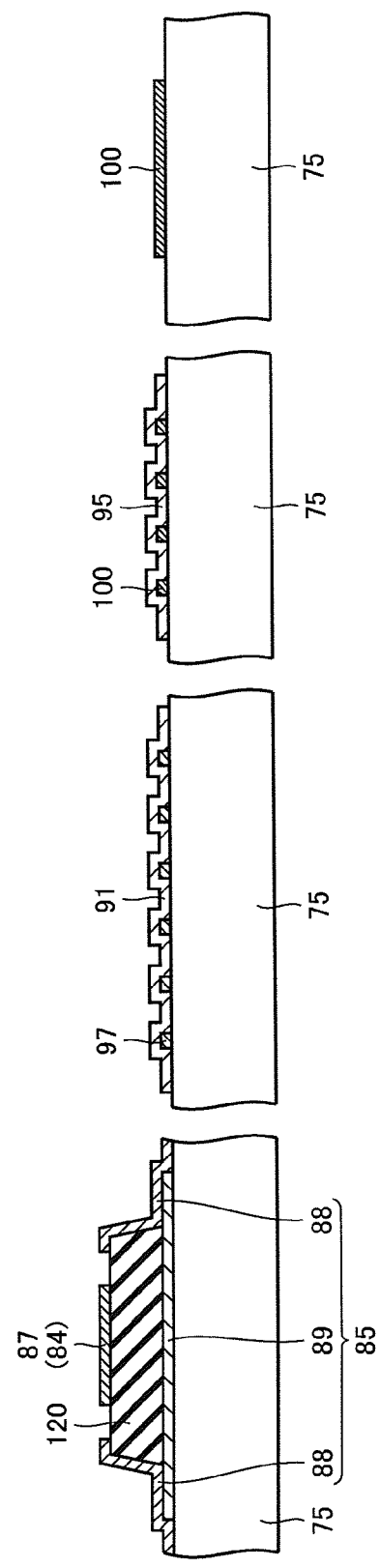
FIG. 34 is a cross-sectional view showing a step after the manufacturing step shown in FIG. 33.

FIG. 34 is a cross-sectional view showing a step after the manufacturing step shown in FIG. 33. Referring to this FIG. 34, the transparent conductive film such as an ITO film or an IZO film is deposited to cover interlayer insulating film 120.

Thereafter, this transparent conductive film is patterned, and thereby, electrode plates 88 are formed at opposing ends of connection piece 89. Second array electrode 85 is thus formed.

Connection piece 87 is also formed above the upper surface of connection piece 89, and electrode plate 86 shown in FIG. 25 is also formed on the upper surface of connection piece 89. First array electrode 84 shown in FIG. 25 is thus formed and the end of first array electrode 84 is connected to wiring main body 98. Similarly, the end of second array electrode 85 is connected to wiring main body portion 96.

Figure 35:
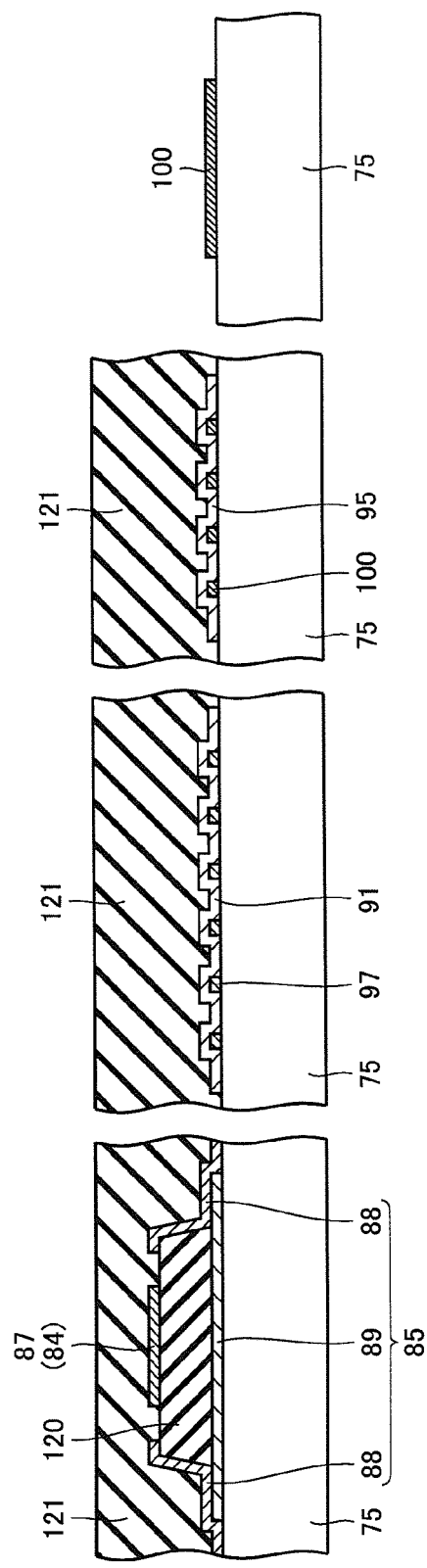
FIG. 35 is a cross-sectional view showing a step after the manufacturing step shown in FIG. 34.

FIG. 35 is a cross-sectional view showing a step after the manufacturing step shown in FIG. 34. As shown in this FIG. 35, the organic insulating film is deposited on the main surface of transparent substrate 75 having first array electrode 84, second array electrode 85 and the like formed thereon.

Thereafter, as shown in FIG. 25, the organic insulating film is patterned to expose a part of terminal portion 77, and thereby, protection film 121 is formed.

This protection film 121 is formed to cover a portion of the main surface of transparent substrate 75 other than the outer perimeter portion where terminal portions 77 are arranged.

Therefore, detection electrode 76, transparent conductive wirings 82 and 83, connection portions 78 and 79, metal wirings 80 and 81, and the like are covered by protection film 121. Touch panel 7 according to the present embodiment can thus be fabricated.

Touch panel 7 configured as described above is assembled with parallax barrier substrate 6, spacer 5, liquid crystal display panel 4, backlight unit 3, and housing 2. Image display device 1 according to this second embodiment can thus be fabricated.

Although the embodiments according to the present invention have been described above, the embodiments disclosed herein are illustrative and not limitative in any respect. The technical scope of the present invention is defined by the terms of the claims, and is intended to include any modifications within the scope and meaning equivalent to the terms of the claims.

INDUSTRIAL APPLICABILITY

The present invention is applicable to a wiring connection structure, a terminal portion, a parallax barrier substrate, and a touch panel.

REFERENCE SIGNS LIST 1 image display device; 2 housing; 3 backlight unit; 4 liquid crystal display panel; 5 spacer; 6 parallax barrier substrate; 7 touch panel; 8 window portion; 9 front surface cover; 10 rear surface cover; 11 substrate; 12 opposed substrate; 15 first substrate; 16 second substrate; 20, 50 transparent substrate; 21 first transparent electrode; 22, 52, 77 terminal portion; 23, 53, 80, 81 metal wiring; 24, 54, 82, 83 transparent conductive wiring; 25, 55, 78, 79 connection portion; 26, 31, 56, 58, 90, 93, 96 wiring main body portion; 27, 28, 32, 57, 59, 60, 91, 92, 95, 97, 99 wide portion; 30, 61, 100 transparent conductive film; 33, 36, 62, 65 edge portion; 34, 37, 66 perimeter wall portion; 35, 38, 103, 108 upper surface portion; 40, 41, 70, 71 short side portion; 42, 43, 72, 73 long side portion; 51 second transparent electrode; 75 transparent substrate; 75 touch panel transparent substrate; 76 detection electrode; 84 first array electrode; 85 second array electrode; 86, 88 electrode plate; 87, 89 connection piece; 97a, 99a, 100a hole; 98 wiring main body; 101, 106 outer edge portion; 102, 107 outer perimeter wall portion; 104, 109 inner perimeter wall portion; 105, 110 closing portion; 120 interlayer insulating film; 121 protection film.

The invention claimed is:

1. A wiring connection structure connecting a transparent conductive film formed on a main surface of a transparent substrate having said main surface and a metal wiring formed on said main surface and made of a metal material, wherein
said metal wiring is formed to extend from said main surface onto said transparent conductive film and to cover said transparent conductive film;
one or more holes are formed in said transparent conductive film to extend from an upper surface to said main surface, and
said metal wiring formed to cover said transparent conductive film is formed to be in contact with said main surface located at said one or more holes.

2. The wiring connection structure according to claim 1, wherein
assuming that a contact area S1 represents a contact area between said transparent conductive film and said metal wiring, and a contact area S2 represents a contact area between said metal wiring and said main surface located at said one or more holes, said contact area S1 and said contact area S2 satisfy a relational expression of (contact area S1)×⅕<(contact area S2).

3. The wiring connection structure according to claim 1, wherein
a plurality of said holes are formed.

4. The wiring connection structure according to claim 1, wherein
said transparent substrate is a glass substrate,
said transparent conductive film is an ITO (Indium Tin Oxide) film, and
said metal material includes at least one of titanium (Ti), molybdenum (Mo), tantalum (Ta), tungsten (W), and chromium (Cr) as a main ingredient.

5. The wiring connection structure according to claim 1, wherein
said transparent conductive film includes a first wiring main body portion and a first wide portion connected to said first wiring main body portion and formed to be wider than said first wiring main body portion,
said metal wiring includes a second wiring main body portion and a second wide portion formed to be wider than said second wiring main body portion and formed to cover said first wide portion, and
when said first wide portion and second wide portion are viewed from a direction perpendicular to said main surface, said first wide portion is located inside said second wide portion.

6. The wiring connection structure according to claim 5, wherein
one or more holes are formed in said first wide portion to extend from an upper surface of said first wide portion to said main surface, and
said second wide portion is formed to cover said first wide portion and to be in contact with said main surface exposed from said one or more holes.

7. The wiring connection structure according to claim 6, wherein
assuming that a contact area S1 represents a contact area between said first wide portion and said second wide portion, and a contact area S2 represents a contact area between said metal wiring and said main surface exposed from said one or more holes, said contact area S1 and said contact area S2 satisfy a relational expression of (contact area S1)×⅕<(contact area S2).

8. The wiring connection structure according to claim 5, wherein
more than a half of an upper surface of said first wide portion is covered by said second wide portion.

9. A terminal portion including the wiring connection structure as recited in claim 1, wherein
more than at least a half of an upper surface of said transparent conductive film is covered by said metal wiring.

10. A parallax barrier substrate including the wiring connection structure as recited in claim 1.

11. A touch panel including the wiring connection structure as recited in claim 1.

* * * * *